United States Patent
Matsumura

(10) Patent No.: US 10,769,090 B2
(45) Date of Patent: Sep. 8, 2020

(54) INFORMATION PROCESSING APPARATUS, CONTROL METHOD OF INFORMATION PROCESSING, AND NON-TRANSITORY COMPUTER-READABLE STORAGE MEDIUM FOR STORING PROGRAM

(71) Applicant: FUJITSU LIMITED, Kawasaki-shi, Kanagawa (JP)

(72) Inventor: Hidetoshi Matsumura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/563,991

(22) Filed: Sep. 9, 2019

(65) Prior Publication Data

US 2020/0004715 A1 Jan. 2, 2020

Related U.S. Application Data

(63) Continuation of application No. PCT/JP2018/002090, filed on Jan. 24, 2018.

(30) Foreign Application Priority Data

Mar. 13, 2017 (JP) ................................ 2017-047222

(51) Int. Cl.
*G06F 9/44* (2018.01)
*G06F 13/40* (2006.01)
*G06F 9/4401* (2018.01)

(52) U.S. Cl.
CPC ........ *G06F 13/4068* (2013.01); *G06F 9/4405* (2013.01); *G06F 9/4411* (2013.01)

(58) Field of Classification Search
CPC ... G06F 13/4068; G06F 9/4405; G06F 9/4411
See application file for complete search history.

(56) References Cited

U.S. PATENT DOCUMENTS 7,840,918 B1 * 11/2010 Duthou .................. G06F 30/39
716/132
8,407,433 B2 * 3/2013 Wingard ............. G06F 12/0607
711/157
(Continued)

FOREIGN PATENT DOCUMENTS

JP H02-249254 A 10/1990
JP H03-034349 A 2/1991
(Continued)

OTHER PUBLICATIONS

International Search Report (Form PCT/ISA/210), mailed in connection with PCT/JP2018/002090 and dated Feb. 20, 2018 (1 pages).

*Primary Examiner* — Henry Tsai
*Assistant Examiner* — Christopher Daley
(74) *Attorney, Agent, or Firm* — Fujitsu Patent Center

(57) ABSTRACT

An information processing apparatus includes: a programmable circuit including a plurality of reconfigurable regions in which logic is reconfigurable; and a processor coupled to the programmable circuit, the processor being configured to (a): execute an extraction process that includes extracting, from the plurality of reconfigurable regions, one or more installable regions in which any of a plurality of first circuits is installable, (b): execute a first determination process that includes determining whether each of a plurality of second circuits is installable in a first reconfigurable region, (c): execute a second determination process that includes determining a first installation circuit and a first installation region based on the determination executed by the first determination process, and (d): execute an installation process that includes installing the first installation circuit determined by the second determination process in the first (Continued)

installation region determined by the second determination process.

13 Claims, 16 Drawing Sheets

(56) References Cited

U.S. PATENT DOCUMENTS

| | | | |
|---|---|---|---|
| 9,038,189 B1* | 5/2015 | Stevens | G06F 21/60 |
| | | | 726/26 |
| 9,503,093 B2* | 11/2016 | Durham | H03K 19/17748 |
| 9,733,855 B1* | 8/2017 | Ong | G06F 1/12 |
| 10,402,219 B2* | 9/2019 | Butcher | G06F 9/45558 |
| 10,523,209 B1* | 12/2019 | Wang | G01R 31/3177 |
| 2013/0019213 A1* | 1/2013 | Panofsky | G06F 30/34 |
| | | | 716/101 |
| 2015/0026450 A1* | 1/2015 | Adiki | G06F 9/4406 |
| | | | 713/100 |
| 2017/0329631 A1* | 11/2017 | Yin | G06F 9/5011 |
| 2018/0165400 A1* | 6/2018 | Feld | G06F 30/392 |

FOREIGN PATENT DOCUMENTS

| | | |
|---|---|---|
| JP | 2000-148707 A | 5/2000 |
| JP | 2001-051826 A | 2/2001 |
| JP | 2015-039155 A | 2/2015 |

\* cited by examiner

FIG. 2

| BASIC CIRCUIT TO BE INSTALLED | A0 | | | A1 | | |
|---|---|---|---|---|---|---|
| INSTALLABLE REGION | (1) | (2) | (3) | (4) | (5) | (6) |
| PROCESS BY EXTRACTING SECTION | | | | | | |
| PROCESS BY FIRST DETERMINING SECTION | | | | | | |
| PROCESS BY SECOND DETERMINING SECTION | | | | | | |

INFORMATION PROCESSING APPARATUS, CONTROL METHOD OF INFORMATION PROCESSING, AND NON-TRANSITORY COMPUTER-READABLE STORAGE MEDIUM FOR STORING PROGRAM

CROSS-REFERENCE TO RELATED APPLICATION

This, application is a continuation application of International Application PCT/JP2018/002090 filed on Jan. 24, 2018 and designated the U.S., the entire contents of which are incorporated herein by reference. The International Application PCT/JP2018/002090 is based upon and claims the benefit of priority of the prior Japanese Patent Application No. 2017-47222, filed on Mar. 13, 2017 the entire contents of which, are incorporated herein by reference.

FIELD

The embodiments discussed herein are related to an information processing apparatus, a control method of information processing, and a non-transitory computer-readable storage medium storing a program.

BACKGROUND

Recently, attention has been focused on an information processing apparatus that causes a programmable device, which is a field-programmable gate array (FPGA) or the like and dynamically reconfigures logic, to function as an accelerator. In an information processing apparatus of this type, in the case where multiple circuits are sequentially programmed in an FPGA and multiple processes are executed, a portion common to the multiple circuits and a portion not overlapping individual portions of the multiple circuits are programmed in the FPGA in advance. After that, a time period for reconfiguring logic is reduced by programming a portion overlapping the individual portions of the circuits in the FPGA at the time of the execution of the processes of the multiple circuits (see, for example, Japanese Laid-open Patent Publication No, 2001-51826).

When a load of a process executed by a circuit programmed in the FPGA increases, the efficiency of the process is improved by copying, to the FPGA, the circuit that executes the process and causing the multiple circuits to execute the process in parallel (see, for example, Japanese Laid-open Patent Publication No. 2000-148707). When the FPGA has multiple divided regions that are program units of the circuits, whether an available divided region is suitable for the shape of a circuit to be programmed in the FPGA is determined based on information of the shape of the circuit. When the available divided region is suitable for the information of the shape of the circuit, the circuit is programmed in the suitable available divided region (see, for example, Japanese Laid-open Patent Publication No. 2015-39155).

SUMMARY

According to an aspect of the embodiments, an information processing apparatus includes: a programmable circuit including a plurality of reconfigurable regions in which logic is reconfigurable; and a processor coupled to the programmable circuit, the processor being configured to (a): execute an extraction process that includes extracting, from the plurality of reconfigurable regions, one or more installable regions in which any of a plurality of first circuits is installable; each of the plurality of first circuits including a first processing section for executing a first process and a first input and output section for receiving and outputting information; the each of the plurality of first circuits being configured so that the positions of the first input and output sections are different from each other when each of the plurality of first circuits is installed in any of the reconfigurable regions, (b): execute a first determination process that includes determining whether each of a plurality of second circuits is installable in a first reconfigurable region; the first reconfigurable region being adjacent to the one or more installable regions extracted by the extraction process; each of the plurality of second circuits including a second processing section for executing the first process and a second input and output section to be coupled to a first input and output section among the first input and output sections; each of the plurality of second circuits corresponding to any of the plurality of first circuits, (c): execute a second determination process that includes determining a first installation circuit and a first installation region based on the determination executed by the first determination process; the first installation circuit being among the plurality of first circuits and to be installed in the programmable circuit; the first installation region being a region that is among the one or more installable regions and in which the first installation circuit is to be installed, and (d): execute an installation process that includes installing the first installation circuit determined by the second determination process in the first installation region determined by the second determination process.

The object, and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 illustrates an example of a process to be executed by an extracting section, a first determining section, and a second determining section that are illustrated in FIG. 1;

DESCRIPTION OF EMBODIMENTS

It is considered that, when a load of a process executed by a basic circuit installed in an FPGA increases, an extension circuit is installed in a region adjacent to the basic circuit and the process is executed by the basic circuit and the extension circuit in parallel to handle the increase in the load. In addition, it is considered that, in order to increase the probability that the extension circuit is installable adjacent to the basic circuit installed in the FPGA regardless of the position of an available region within the FPGA, coupling portions to be coupled to the extension circuit are installed over multiple sides of the basic circuit. However, as the number of coupling portions to be installed in the basic circuit is larger, the size of a processing section for executing the process may be smaller and processing performance of the basic circuit may be lower.

According to an aspect, the present disclosure aims to reduce the size of a circuit of a first input and output section to be coupled to a second circuit when processing performance of a first circuit installed in a programmable section is insufficient.

Hereinafter, embodiments are described with reference to the accompanying drawings. A reference symbol of a signal line via which a signal is transmitted is the same as the name of the signal.

Figure 1:
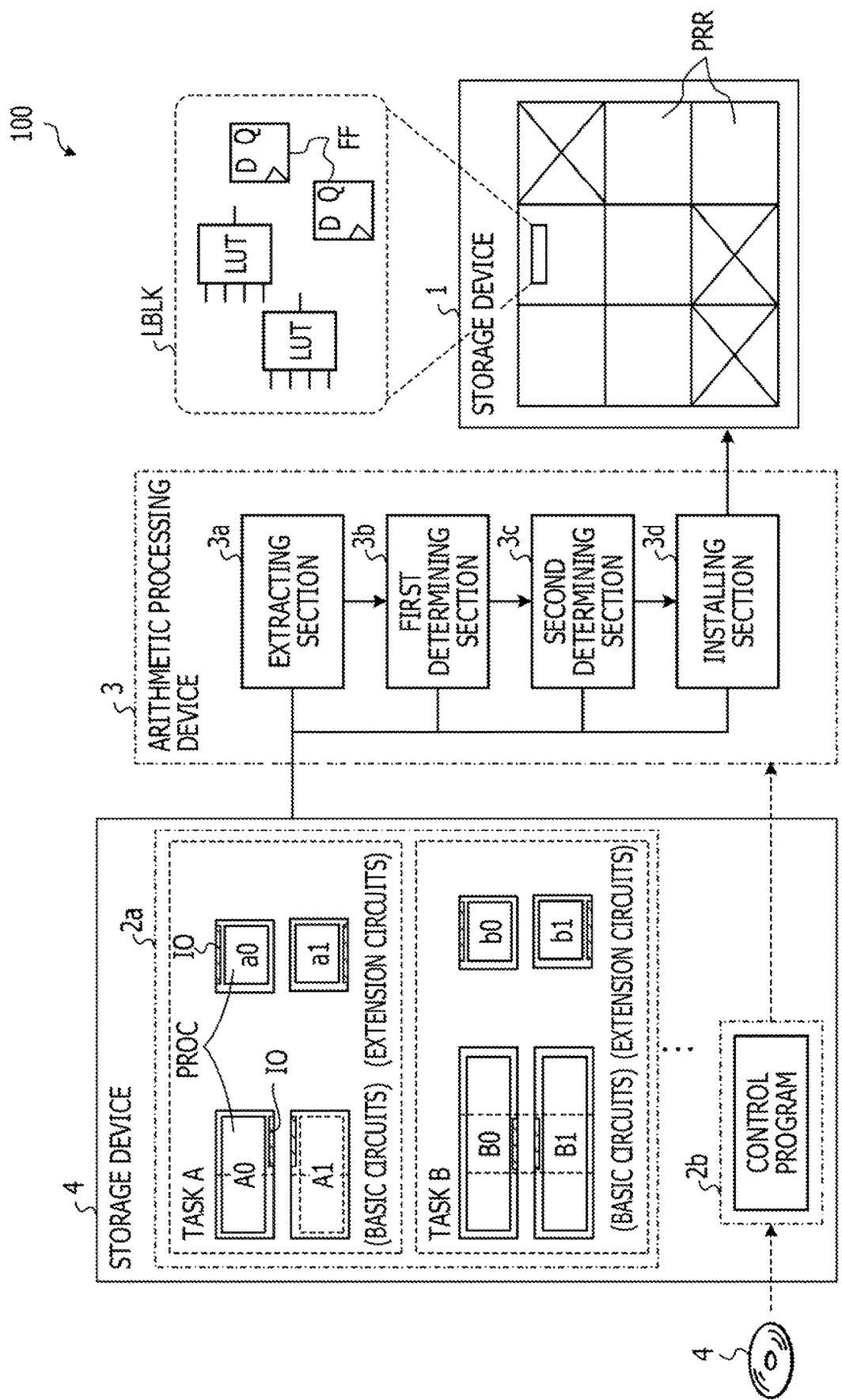
FIG. 1 describes an embodiment of an information processing apparatus, a method for controlling the information processing apparatus, and a program for controlling the information processing apparatus.

FIG. 1 illustrates an embodiment of an information processing apparatus, a method for controlling the information processing apparatus, and a program for controlling the information processing apparatus. An information processing apparatus 100 illustrated in FIG. 1 is, for example, a server and includes a programmable section 1 such as an FPGA, a storage device 2 such as a memory module, and an arithmetic processing device 3 such as a central processing unit (CPU). The storage device 2 may be installed outside the information processing apparatus 100. The information processing apparatus 100 may include a hard disk drive (HDD), a communication interface, and the like, as well as the sections illustrated in FIG. 1.

The programmable section 1 includes multiple logical blocks LBLK, each of which uses a static random access memory (SRAM) or the like to hold multiple lookup tables LUT and multiple flip-flops FF. Although not illustrated, the programmable section 1 includes lines coupling the logical blocks LBLK to each other, a switch matrix, and block memories storing work data and the like.

In each of the logical blocks LBLK, a combinational circuit is built by writing logic to lookup tables LUT and coupling the lookup tables LUT to each other via a line and the switch matrix. Circuits are sequentially built by inserting the flip-flops FF between the lookup tables LUT and coupling the lookup tables to the block memories via the lines and the switch matrix.

Multiple rectangular partial reconfigurable regions PRR in which logic is reconfigurable are built in the programmable section 1. The lines, which couple the blocks to each other, are installed around the partial reconfigurable regions PRR and include a common line commonly used for the partial reconfigurable regions PRR and dedicated lines installed between the partial reconfigurable regions PRR adjacent to each other. The partial reconfigurable regions PRR, the common line, and the dedicated lines may be physically built in the programmable section 1.

In FIG. 1, the programmable section 1 includes the nine partial reconfigurable regions PRR. The number of partial reconfigurable regions PRR, however, is not limited to nine. For example, the number of partial reconfigurable regions PRR is determined so that the programmable section 1 is formed in a rectangular shape. The partial reconfigurable regions PRR are hereinafter referred to as reconfigurable regions PRR. In FIG. 1, in each of reconfigurable regions PRR indicated by symbols X, a basic circuit is already installed and a new circuit may not be installed, for example.

The storage device 2 includes a semiconductor memory such as a synchronous dynamic random access memory (SDRAM), an SRAM, or a flash memory. The storage device 2 includes a storage region 2a for storing configuration information of logic (circuits) to be programmed in the programmable section 1 and a storage region 2b for storing a control program.

The configuration information may be stored in a storage region that is included in the information processing apparatus 100 and is not included in the storage device 2. Alternatively, the configuration information may be stored in an external storage region of the information processing apparatus 100. The control program may be stored in a computer-readable recording medium 4 such as a compact disc read only memory (CD-ROM), a digital versatile disc (DVD), or a Universal Serial Bus (USS) memory. In this case, the control program stored in the recording medium 4 is transferred to the storage region 2b from the recording medium 4 via an input and output interface (not illustrated) included in the information processing apparatus 100. The control program may be transferred from the recording medium 4 to an HDD (not illustrated) and transferred from the HDD to the storage region 2b.

In the example illustrated in FIG. 1, configuration information A0, A1, a0, and a1 to be used to execute a task A in the programmable section 1, and configuration information B0, B1, b0, and b1 to be used to execute a task B in the programmable section 1 are stored in the storage region 2a. In FIG. 1, the configuration information is indicated by quadrangles indicating the shapes of circuits to be programmed in the programmable section 1 in order to clarify description. Internal rectangles included in the quadrangles indicating the configuration information indicate processing sections PROC for executing processes of the tasks. A thin long rectangle that is indicated over one of four sides of each of the rectangles and in which diagonal lines are illustrated indicates an input and output section IO for receiving and outputting information such as data.

The configuration information A0, A1, and the like indicated using the capital letters is initially programmed in the programmable section 1 in the case where the tasks are executed in the programmable section 1. In the following description, the configuration information indicated using the capital letters are also referred to as basic circuits in some cases. Processing sections PROC of basic circuits (for example, A0 and A1) indicated using the same capital letter execute the same process and have the same processing performance, but the positions of input and output sections IO of the basic circuits indicated using the same capital letter when each of the basic circuits is programmed in any one or more of the reconfigurable regions PRR are different from each other.

The configuration information indicated using the lower-case letters a0, a1, and the like is programmed in the programmable section 1 when loads of the tasks increase and processing performance of the basic circuits is insufficient during the execution of the tasks by the basic circuits programmed in the programmable section 1. In the following description, the configuration information indicated using the lower-case letters also are referred to as extension circuits in some cases. Processing sections PROC of extension circuits (for example, a0 and a1) indicated using the same lower-case letter execute the same process and have the same processing performance, but the positions of input and output sections IO of the extension circuits indicated using the same lower-case letter when each of the extension circuits is programmed in any of the reconfigurable regions PRR are different from each other. Programming configuration information in the programmable section 1 is hereinafter also referred to installing a circuit in some cases.

The basic circuits A0 and A1 are an example of first circuits. The extension circuits a0 and a1 are an example of second circuits. Each of processing sections PROC of the basic circuits A0 and A1 is an example of a first processing section. Each of input and output sections IO of the basic circuits A0 and A1 is an example of a first input and output section. Each of processing sections PROC of the extension circuits a0 and a1 is an example of a second processing section. Each of input and output sections IO of the extension circuits a0 and a1 is, an example of a second input and output section. A process to be executed by the processing sections PROC of the basic circuits A0 and A1 and the process to be executed by the processing sections PROC of the extension circuits a0 and a1 are an example of a first process.

Basic circuits indicated using the same alphabet have the same logic and the same size. The number of reconfigurable regions PRR in which one of the basic circuits indicated using the same alphabet is programmed is equal to the number of reconfigurable regions PRR in which the other of the basic circuits indicated using the same alphabet is programmed. Extension circuits indicated using the same alphabet have the same logic and the same size. The number of reconfigurable regions PRR in which one of the extension circuits indicated using the same alphabet is programmed is equal to the number of reconfigurable regions PRR in which the other of the extension circuits indicated using the same alphabet is programmed. For example, each of the basic circuits A0 and A1 are installable in two reconfigurable regions PRR adjacent to each other in a horizontal direction, and each of the basic circuits B0 and B1 are installable in three reconfigurable regions PRR adjacent to each other in the horizontal direction. Each of the extension circuits a0, a1, b0, and b1 is installable in any of the reconfigurable regions PRR.

A side that is among four sides of any of basic circuits indicated using the same alphabet and on which an input and output section IO included in the basic circuit is located is different from a side that is among four sides of the other of the basic circuits indicated using the same alphabet and on which an input and output section IO included in the other basic circuit is located, while directions in which the basic circuits are coupled to extension circuits are different from each other due to the positions of the input and output sections IO. Each of the basic circuits may be coupled to an extension circuit indicated by the same alphabet and number as the basic circuit. By installing a single input and output section IO over one of four sides of each of the basic circuits, a direction in which the basic circuit is coupled to an extension circuit corresponding to the basic circuit is limited. By installing a single input and output section IO over one of four sides of each of the basic circuits, the size of a circuit of each of the input and output sections IO may be reduced and the size of a circuit of each of the processing sections PROC may be relatively increased, compared with the case where input and output sections IO are installed over multiple sides of each of the basic circuits. Thus, the processing performance of the basic circuits may be improved, compared with the case where input and output sections IO are installed over two or more of four sides of each of the basic circuits. As a result, the frequency with which an extension circuit is additionally installed may be reduced, and a load of the arithmetic processing device 3 for controlling the installation of the extension circuits in the programmable section 1 may be reduced.

For example, when the basic circuit A0 is installed in the programmable section 1, and task A processing performance of the basic circuit A0 is insufficient, the extension circuit a0 is installed in a reconfigurable region PRR located over the lower right side of the basic circuit A0 and adjacent to any of reconfigurable regions PRR in which the basic circuit A0 is installed. When the basic circuit A1 is installed in the programmable section 1, and task A processing performance of the basic circuit A1 is insufficient, the extension circuit a1 is installed in a reconfigurable region PRR located over the upper right side of the basic circuit A1 and adjacent to any of reconfigurable regions PRR in which the basic circuit A1 is installed. Then, the task A is executed by the basic circuit A0 and the extension circuit a0 in parallel or executed by the basic circuit A1 and the extension circuit a1 in parallel. For example, by installing the extension circuit a0 in the programmable section 1, the circuits for executing the task A in parallel may be built in the programmable section 1 using the minimum number of reconfigurable regions PRR, compared with the case where multiple basic circuits A0 are installed in the programmable section 1. As a result, the probability that a circuit for executing the other task is installable in reconfigurable regions PRR increases, and task processing performance of the information processing apparatus 100 may be improved.

The arithmetic processing device 3 includes an extracting section 3a, a first determining section 3b, a second determining section 3c, and an installing section 3d. Functions of the extracting section 3a, the first determining section 3b, the second determining section 3c, and the installing section 3d are enabled by causing a CPU core (not illustrated) of the arithmetic processing device 3 or the like to execute the control program stored in the storage region 2b. One or more of the extracting section 3a, the first determining section 3b, the second determining section 3c, and the installing section 3d may be installed as hardware (circuit) in the information processing apparatus 100. In this case, one or more of the extracting section 3a, the first determining section 3b, the second determining section 3c, and the installing section 3d may be enabled using the programmable section 1.

The extracting section 3a extracts, for each of multiple basic circuits corresponding to a task to be executed, an installable region, which is a reconfigurable region PRR in which the basic circuit is installable, from reconfigurable regions PRR in which a circuit is not installed, based on an instruction to execute the task in the programmable section 1. When the installable regions are extracted by the extracting section 3a, the first determining section 3b determines, for each of the installable regions, whether an extension circuit to be coupled to a basic circuit to be installed in the installable region is installable in a reconfigurable region PRR adjacent to the installable region.

The second determining section 3c determines, based on the determination executed by the first determining section 3b, a basic circuit that is among the multiple basic circuits and is to be actually installed in an installable region and the position of the reconfigurable region PRR in which the basic circuit is to be installed. The basic circuit determined by the second determining section 3c to be installed is an example of a first installation circuit. The reconfigurable region PRR, which has been determined by the second determining section 3c and in which the basic circuit determined by the second determining section 3c is to be installed, is an example of a first installation region.

The installing section 3d installs the basic circuit determined by the second determining section 3c in the reconfigurable region PRR determined by the second determining section 3c. For example, the installing section 3d transfers, to the programmable section 1, configuration information of the basic circuit determined by the second determining section 3c to be installed and positional information indicating the position of the reconfigurable region PRR in which the configuration information is to be programmed. The programmable section 1 programs the basic circuit in the reconfigurable region PRR based on the information received from the installing section 3d. When the first determining section 3b determines that an installable region has not been extracted by the extracting section 3a, the second determining section 3c and the installing section 3d are not operated and the task is executed by software such as an application program executed by the CPU core of the arithmetic processing device 3.

When a load of the task increases and task processing performance of the basic circuit installed in the programmable section 1 is insufficient during the execution of a process of the task by the basic circuit, and an extension circuit is installable in a reconfigurable region PRR, the installing section 3d installs the extension circuit in the programmable section 1. Whether the extension circuit is installable in the reconfigurable region PRR is already determined by the first determining section 3b. For example, the arithmetic processing device 3 that monitors the load of the task instructs the installing section 3d to install the extension circuit.

FIG. 2 illustrates an example of a process to be executed by the extracting section 3a, the first determining section 3b, and the second determining section 3c that are illustrated in FIG. 1. FIG. 2 illustrates an example of a method for controlling the information processing apparatus 100. In FIG. 2, the arithmetic processing device 3 determines, based on the issuance of a request to install a circuit for executing the task A in the programmable section 1, the basic circuit A0 or A1 to be installed and reconfigurable regions PRR in which the basic circuit A0 or A1 is to be installed. Similarly to FIG. 1, other basic circuits are already installed in three reconfigurable regions PRR indicated by symbols X, similarly to FIG. 1.

First, the extracting section 3a extracts, for the basic circuits A0 and A1, reconfigurable regions PRR (installable regions) in which the basic circuits A0 and A1 are installable from six reconfigurable regions PRR in which a circuit is not installed. In the example illustrated in FIG. 2, the extracting section 3a extracts three installable regions (1), (2), and (3) in which the basic circuit A0 is installable and three installable regions (4), (5), and (6) in which the basic circuit A1 is installable. The installable regions (1) to (6) are indicated by bold frames.

Then, the first determining section 3b determines, for each of the installable regions (1) to (3), whether the extension circuit a0 is installable in a reconfigurable region PRR adjacent to the installable region. Then, the first determining section 3b determines, for each of the installable regions (4) to (6), whether the extension circuit a1 is installable in a reconfigurable region PRR adjacent to the installable region. In the example illustrated in FIG. 2, the first determining section 3b determines that the extension circuit a0 is installable in a reconfigurable region PRR adjacent to the installable region (1) and is installable in a reconfigurable region PRR adjacent to the installable region (3) and that the extension circuit a1 is installable in a reconfigurable region PRR adjacent to the installable region (5). In the example illustrated in FIG. 2, the first determining section 3b determines that the extension circuit a0 is not installable in a reconfigurable region PRR adjacent to the installable region (2) and that the extension circuit a1 is not installable in a reconfigurable region PRR adjacent to the installable region (4) and is not installable in a reconfigurable region PRR adjacent to the installable region (6).

Then, the second determining section 3c determines reconfigurable regions PRR that are among the installable regions (1) to (6) and in which the basic circuit A0 or A1 is to be installed. First, the second determining section 3c selects, from among the installable regions (1) to (6), the installable regions (1), (3), and (5) that are adjacent to other installable regions and in which the extension circuit a0 or a1 is installable. Then, the second determining section 3c selects the installable region (3) from among the installable regions (1), (3), and (5) so that available regions (indicated by white rectangles), which are after the installation of the basic circuit A0 and the extension circuit a0 in the reconfigurable regions PRR or are after the installation of the basic circuit A1 and the extension circuit a1 in the reconfigurable regions PRR, are not separated from each other and are located in the minimum region. For example, the second determining section 3c determines that the basic circuit A0 is to be installed in the installable region (3). After that, the installing section 3d installs configuration information of the basic circuit A0 in the programmable section 1 in accordance with the determination executed by the second determining section 3c.

The second determining section 3c may determine, based on a requirement other than the state of an available region, reconfigurable regions PRR in which the basic circuit A0 or A1 is to be installed. For example, after the basic circuit A0 or A1 is installed in the programmable section 1, other basic circuits may be installed in two reconfigurable regions PRR adjacent to each other in the horizontal direction and two reconfigurable regions PRR adjacent to each other in a vertical direction. In this case, the second determining section 3c may determine either the installable region (2) or the installable region (4) as reconfigurable regions PRR in which the basic circuit A0 (or A1) is to be installed.

Figure 3:
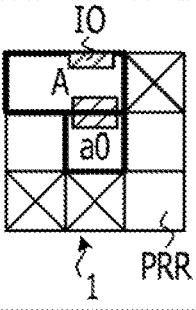
FIG. 3 illustrates an example in which a circuit is installed by another information processing apparatus that does not include the extracting section, the first determining section, and the second determining section that are illustrated in FIG. 1.

FIG. 3 illustrates an example in which a circuit is installed by another information processing apparatus that does not include the extracting section 3a, the first determining section 3b, and the second determining section 3c that are illustrated in FIG. 1. Components that are the same as or similar to those illustrated in FIG. 2 will not be described in detail. A basic circuit A illustrated in a first example has input and output sections IO over upper right and lower right sides of the basic circuit A. A basic circuit A illustrated in a second example has input and output sections IO over upper right, upper left, lower right, and lower left sides of the basic circuit A. When task processing performance of each of the basic circuits A is insufficient, any of the extension circuits a0 and a1 is coupled to the basic circuit A. In FIG. 3, other basic circuits are already installed in three reconfigurable regions PRR indicated by symbols X, and a new circuit is installable in each of six reconfigurable regions PRR in which a circuit is not installed, similarly to FIGS. 1 and 2.

In each of the first and second examples, three installable regions (1), (2), and (3) exist, similarly to the installable regions (1), (2), and (3) or (4), (5), and (6) illustrated in FIG. 2. However, since each of the basic circuits A includes multiple input and output sections IO, the extension circuit a0 or a1 is installable in any of reconfigurable regions PRR adjacent to the installable regions (1) to (3).

When each of the basic circuits A includes multiple input and output sections IO, the number of choices for a reconfigurable region PRR in which the extension circuit a0 or a1 is installable increases. However, as the number of input and output sections IO of each of the basic circuits A is larger, the sizes of circuits of the input and output sections IO are larger and thus the size of a circuit of a processing section PROC for executing a process in the basic circuit A is relatively reduced. As a result, as the number of input and output sections IO of each of the basic circuits A is larger, task processing performance of the basic circuit A is lower.

Figure 4:
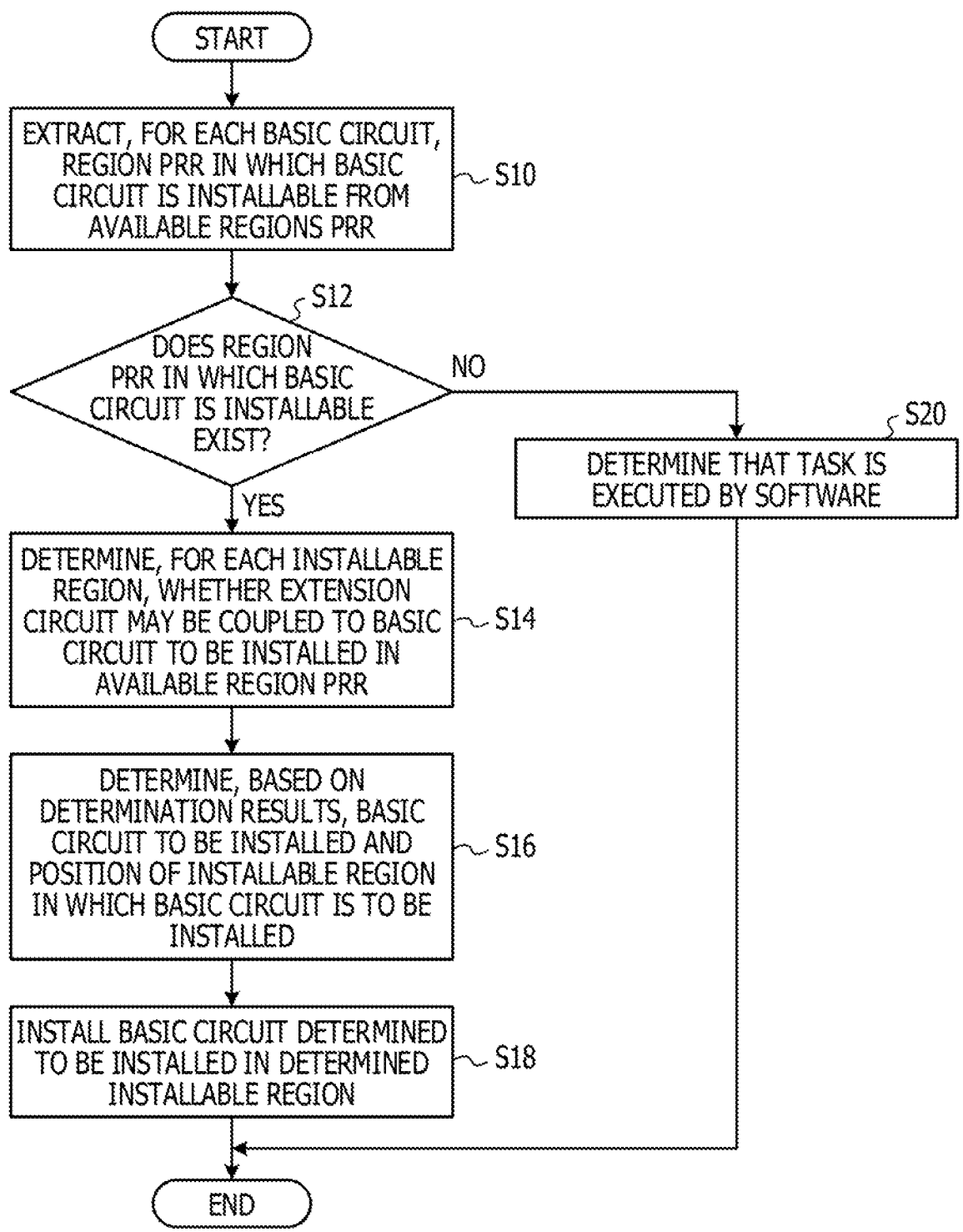
FIG. 4 illustrates an example of a process by a control program to be executed by the information processing apparatus illustrated in FIG. 1.

FIG. 4 illustrates an example of a process by the control program to be executed by the information processing apparatus 100 illustrated in FIG. 1. FIG. 4 illustrates an example of the method for controlling the information processing apparatus 100. As described with reference to FIG. 1, the control program is executed by the CPU core of the arithmetic processing device 3. A process illustrated in FIG. 4 is started based on the issuance of a request to install a circuit for executing a task in the programmable section 1.

First, in step S10, the control program extracts, for each of multiple basic circuits, a reconfigurable region PRR (installable region) in which the basic circuit is installable from available reconfigurable regions PRR in which a circuit is not installed. Next, in step S12, the control program determines whether a reconfigurable region PRR in which a basic circuit is installable exists, based on results of the extraction of step S10. When the reconfigurable region PRR in which the basic circuit is installable exists, the process proceeds to step S14. When the reconfigurable region PRR in which the basic circuit is installable does not exist, the process proceeds to step S20.

In step S14, the control program determines, for each of the installable regions, whether an extension circuit may be coupled to a basic circuit to be installed in the available reconfigurable region PRR. Next, in step S16, the control program determines, based on results of the determination of step S14, a basic circuit to be installed in the programmable section 1 and the position of an installable region in which the basic circuit is to be installed.

Next, in step S18, the control program controls the programmable section 1 and installs the basic circuit determined in step S16 in the installable region determined in step S16. After step S18, the control program terminates the process. After that, a process of the task is started by the basic circuit installed in the installable region. When task processing performance of the basic circuit is insufficient and an extension circuit may be coupled to the basic circuit, the extension circuit is installed in the programmable section 1, and the process of the task is executed by the basic circuit and the extension circuit in parallel.

On the other hand, when the reconfigurable region PRR in which the basic circuit is installable does not exist, the control program determines that the task is executed by software such as an application program in step S20. After step S20, the control program terminates the process. When the reconfigurable region PRR in which the basic circuit is installable does not exist, the task may be executed by the software to suppress a failure such as inexecution of the task.

In the embodiment described with reference to FIGS. 1 to 4, the multiple basic circuits, which may be coupled to extension circuits via input and output sections IO in different directions, are prepared in advance. A basic circuit to be installed in the programmable section 1 and the position of a reconfigurable region PRR in which the basic circuit is to be installed are determined based on one or more available reconfigurable regions PRR and the probability that an extension circuit is installed. Thus, the sizes of the circuits of the input and output sections IO may be reduced and the sizes of the circuits of processing sections PROC of the basic circuits may be relatively increased, compared with a basic circuit having multiple input and output sections IO and may be coupled to extension circuits in multiple directions. Thus, the processing performance of the basic circuits may be improved, compared with the case where input and output sections IO are installed over two or more sides of each of the basic circuits. As a result, the frequency with which an extension circuit is additionally installed may be reduced, and the load of the arithmetic processing device 3 for controlling the installation of the extension circuits in the programmable section 1 may be reduced.

Figure 5:
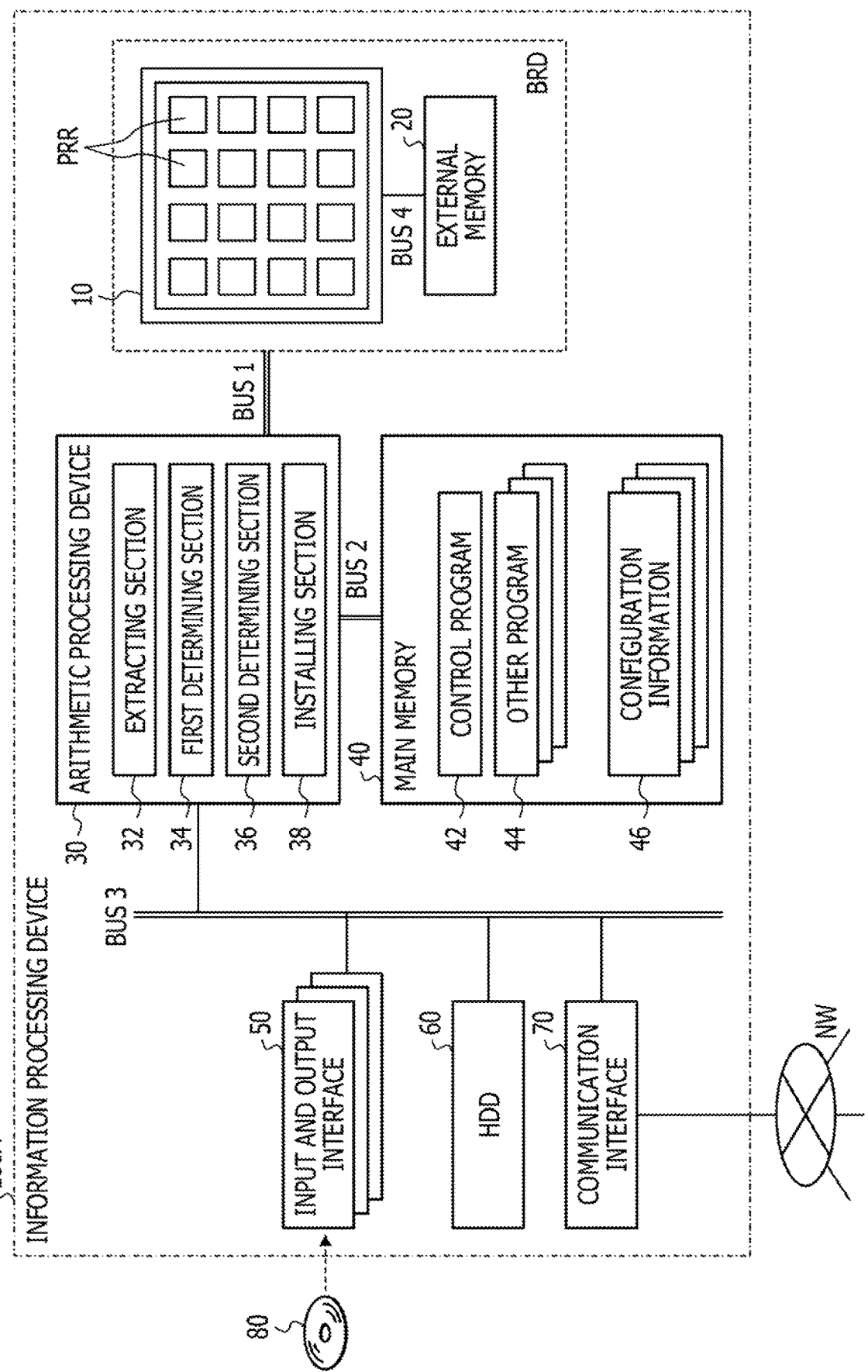
FIG. 5 illustrates another embodiment of an information processing apparatus, a method for controlling the information processing apparatus, and a program for controlling the information processing apparatus.

FIG. 5 illustrates another embodiment of an information processing apparatus, a method for controlling the information processing apparatus, and a control program for controlling the information processing apparatus. Components that are the same as or similar to those described with reference to FIGS. 1 to 4 in the embodiment are denoted by the same reference symbols and will not be described in detail. An information processing apparatus 100A illustrated in FIG. 5 is, for example, a server. The information processing apparatus 100A includes a programmable section 10 such as an FPGA, an external memory 20, an arithmetic processing device 30 such as a CPU, a main memory 40, input and output interfaces 50, an HDD 60 and a communication interface 70.

Figure 6:
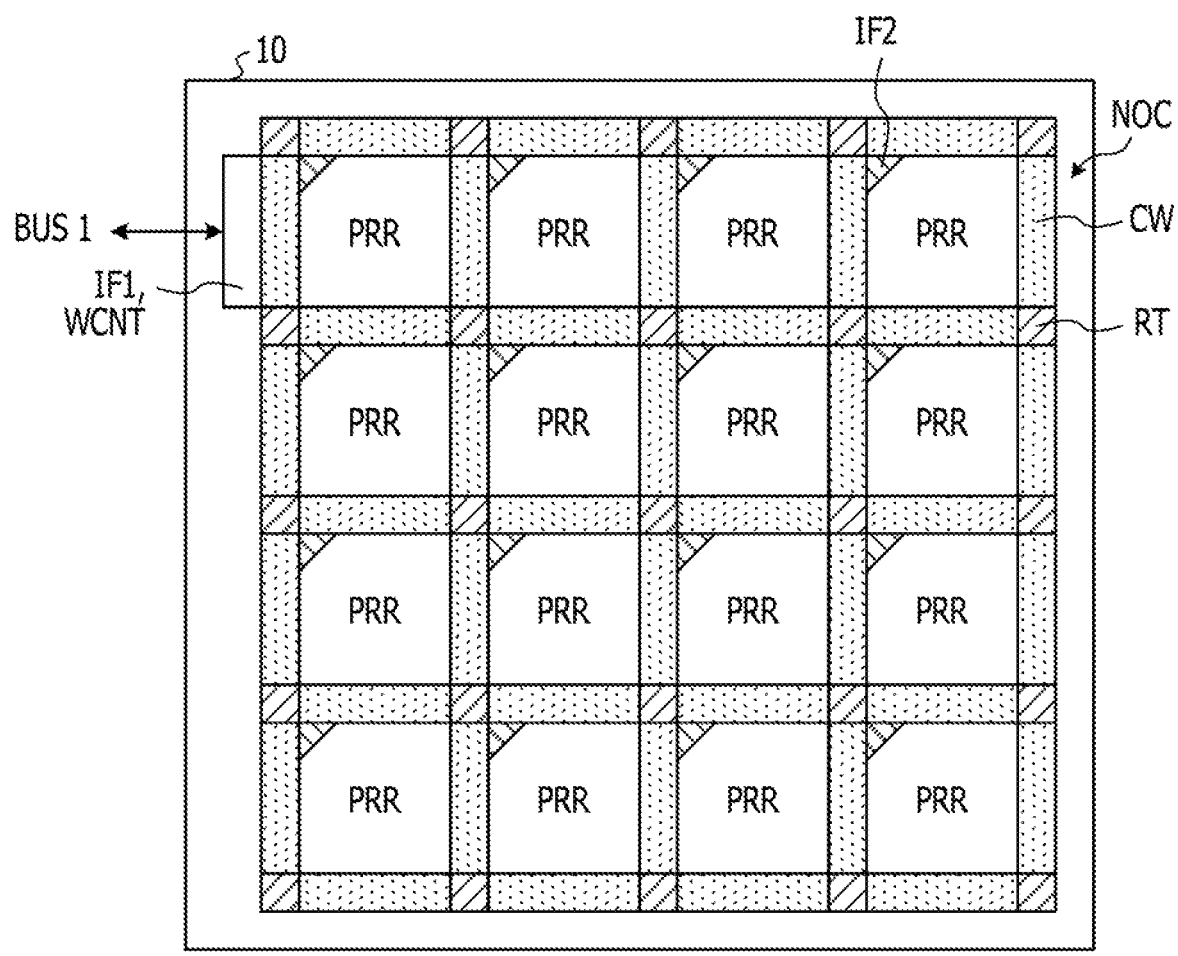
FIG. 6 illustrates an example of a programmable section illustrated in FIG. 5.

The programmable section 10 has the same configuration as the programmable section 1 illustrated in FIG. 1, except that the number of reconfigurable regions PRR of the programmable section 10 is different from the number of reconfigurable regions PRR of the programmable section 1. The programmable section 10 includes multiple logical blocks LBLK, block memories, lines, and a switch matrix that are the same as those described with reference to FIG. 1. In the programmable section 10, sixteen reconfigurable regions PRR in which logic is programmable, and interblock coupling circuits (not illustrated) are built. An example of the programmable section 10 is illustrated in FIG. 6. The programmable section 10 and the external memory 20 are mounted over an extension board BRD and coupled to each other via a dedicated bus BUS4. The external memory 20 holds data to be used for a process to be executed by the programmable section 10, data after the process, and the like.

The programmable section 10 is coupled to the arithmetic processing device 30 via a bus BUS1. The main memory 40 is coupled to the arithmetic processing device 30 via a bus BUS2. The input and output interfaces 50, the HDD 60, and the communication interface 70 are coupled to the arithmetic processing device 30 via a bus BUS3. For example, the buses BUS1 and BUS3 are Peripheral Component Interconnect express (PCIe) buses, and the bus BUS2 is a memory bus.

The arithmetic processing device 30 controls an entire operation of the information processing apparatus 100A and executes a control program 42 stored in the main memory 40 to function as an extracting section 32, a first determining section 34, a second determining section 36, and an installing section 38. The arithmetic processing device 30 executes another program 44 stored in the main memory 40 to enable a function other than the extracting section 32, the first determining section 34, the second determining section 36, and the installing section 38. The extracting section 32, the first determining section 34, the second determining section 36, and the installing section 38 may be installed as hardware (circuits) in the information processing apparatus 100A. In this case, one or more of the extracting section 32, the first determining section 34, the second determining section 36, and the installing section 38 may be enabled using the programmable section 10.

The main memory 40 is, for example, a memory module having multiple SDRAMs and includes a region for storing the control program 42, the other program 44, and configuration information 46. For example, the control program 42, the other program 44, and the configuration information 46 are stored in a computer-readable recording medium 80 such as a CD-ROM, a DVD, or a USB memory or stored in the HDD 60 via a network NW and transferred to the main memory 40.

The extracting section 32 extracts, for each of multiple basic circuits for executing a task, an installable region, which is a reconfigurable region PRR in which the basic circuit is installable, from reconfigurable regions PRR in which a circuit is not installed, based on an instruction to execute the task in the programmable section 10. When the installable regions are extracted by the extracting section 32, the first determining section 34 determines, for each of the installable regions, whether an extension circuit to be coupled to a basic circuit to be installed in the installable region is installable in a reconfigurable region PRR adjacent to the installable region.

The second determining section 36 determines, based on the determination executed by the first determining section 34, a basic circuit that is among the multiple basic circuits and is to be installed in an installable region and the position of a reconfigurable region PRR in which the basic circuit is to be installed. The basic circuit determined by the second determining section 36 to be installed is an example of the first installation circuit. The reconfigurable region PRR, which has been determined by the second determining section 36 and in which the basic circuit is to be installed, is an example of the first installation region.

The installing section 38 installs the basic circuit determined by the second determining section 36 to be installed in the reconfigurable region PRR determined by the second determining se ion 36. For example, the installing section 38 transfers, to the programmable section 10, configuration information of the basic circuit determined by the second determining section 36 to be installed and positional information indicating the position of the reconfigurable region PRR in which the configuration information is to be programmed. The programmable section 10 programs the basic circuit in the reconfigurable region PRR based on the information received from the installing section 38. When the first determining section 34 determines that an installable region has not been extracted by the extracting section 32, the second determining section 36 and the installing section 38 are not operated and the task is executed by software such as an application program executed by a CPU core of the arithmetic processing device 30.

One of the input and output interfaces 50 is coupled to an optical drive device into which a recording medium 80 such as a DVD is inserted. Alternatively, the one of the input and output interfaces 50 has a coupler to which a USB memory or the like is coupled. The other input and output interfaces 50 are coupled to input devices (not illustrated) such as a mouse and a keyboard and to an output device (not illustrated) such as a display.

The HDD 60 stores the control program 42, the other program 44, the configuration information 46, and the like, as described above. The communication interface 70 is coupled to the network NW such as the Internet or an intranet and receives and outputs information from and to the network NW.

FIG. 6 illustrates the example of the programmable section 10 illustrated in FIG. 5. The programmable section 10 has a line network NOC formed in a mesh shape around the reconfigurable regions PRR. The line network NOC includes common lines CW commonly used by the sixteen reconfigurable regions PRR and routers RT installed at intersections of the common lines CW. The common lines CW are coupled to the bus BUS1 via a coupling interface IF1 and a writing controller WCNT. The writing controller WCNT has a function of programming logic (circuit) in a predetermined reconfigurable region PRR based on configuration information transferred via the bus BUS1. The configuration information includes information indicating the logic to be programmed and information indicating the position of the reconfigurable region PRR in which the logic is to be programmed. A coupling interface IF2 is installed at one corner of each of the rectangular reconfigurable regions PRR and coupled to one or more of the common lines CW.

Each of the routers RT couples a predetermined reconfigurable region PRR to another predetermined reconfigurable region PRR via a common line CW. The transfer of information from a reconfigurable region PRR to another reconfigurable region PRR via a common line CW and a router RT is executed sing a packet, for example.

Reconfigurable regions PRR forming a pair and adjacent to each other via a common line CW may be directly coupled to each other via a dedicated line (not illustrated) extending across the common line CW. A bus width of the dedicated line may be arbitrarily set and may be larger than a bus width of the common line CW so that information is directly transmitted from one of the adjacent reconfigurable regions PRR to the other of the adjacent reconfigurable regions PRR without a router RT. The rate at which information is transferred using the dedicated line may be higher than the rate at which the information is transferred using the common line CW. For example, the dedicated line is built using a line layer different from a line layer in which the common line CW is built.

Figure 7:
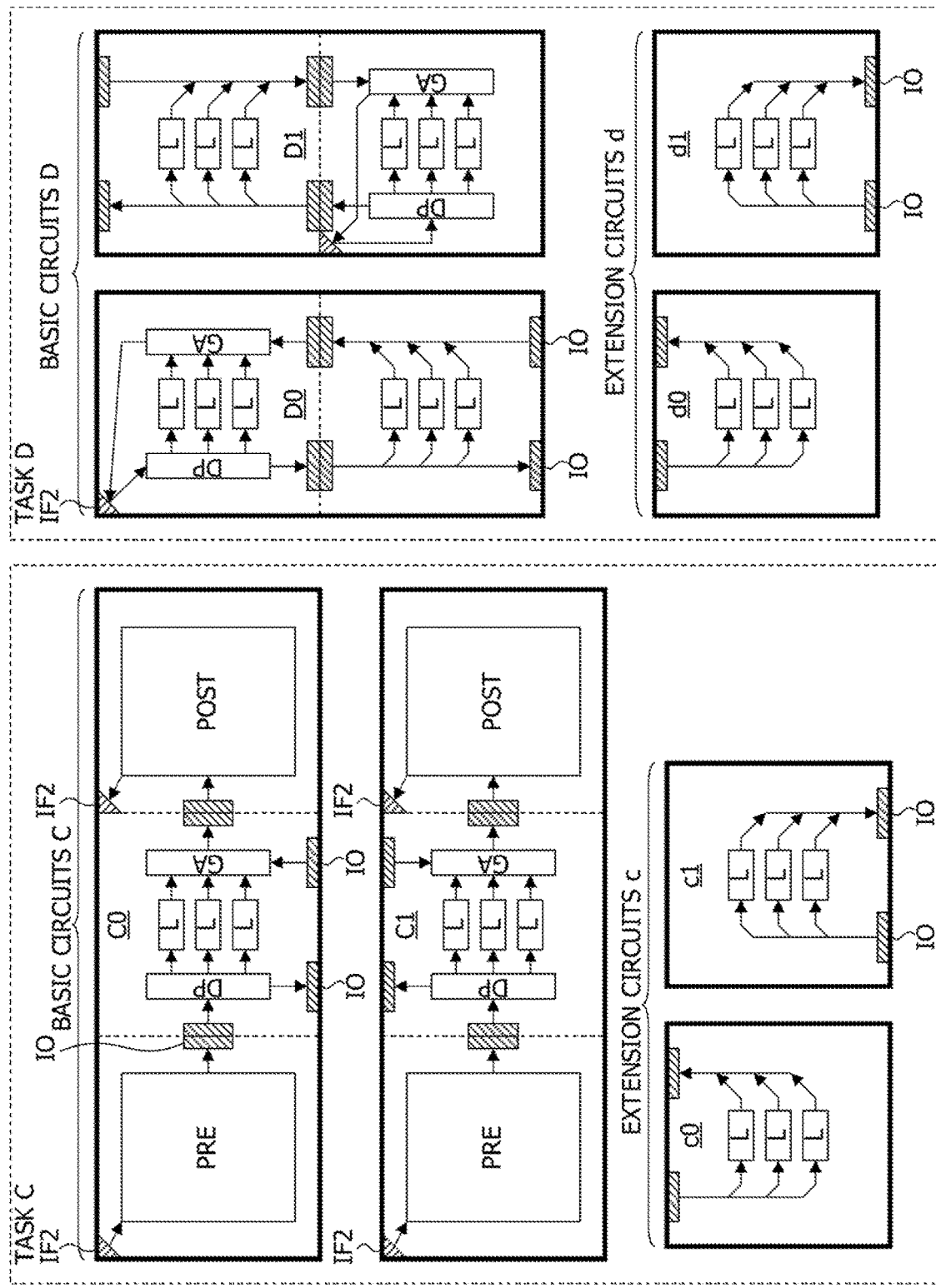
FIG. 7 illustrates an example of configuration information stored in a main memory illustrated in FIG. 5.

FIG. 7 illustrates an example of the configuration information stored in the main memory 40 illustrated in FIG. 5. In FIG. 7, the configuration information is indicated by quadrangles indicating the shapes of circuits to be programmed in the programmable section 10 in order to clarify the following description. Rectangles with diagonal lines indicate input and output sections IO that couple the reconfigurable regions PRR illustrated in FIG. 6 to each other and include the dedicated lines described with reference to FIG. 6. Triangles with diagonal lines indicate the coupling interfaces IF2 to be coupled to the common lines CW illustrated in FIG. 6. The coupling interfaces IF2 are installed in only reconfigurable regions PRR to and from which information such as a signal is input and output.

Configuration information C0 and C1 is used to install basic circuits C in the programmable section 10. Configuration information c0 and c1 is used to install extension circuits c in the programmable section 10. A task C is executed based on any of the configuration information C0 programmed in the programmable section 10, the configuration information C1 programmed in the programmable section 10, the configuration information C0 and c0 programmed in the programmable section 10, and the configuration information C1 and c1 programmed in the programmable section 10. The configuration information C0 and C1 is hereinafter also referred to as basic circuits C0 and C1. The configuration information C0 and c1 is hereinafter also referred to as extension circuits c0 and c1.

Each of the basic circuits C0 and C1 is installed using three reconfigurable regions PRR adjacent to each other in the horizontal direction, while each of the extension circuits C0 and c1 is installed using one reconfigurable region PRR. Each of the basic circuits C0 and C1 includes a preprocessing section PRE, a dispatcher DP, multiple logic sections L, a collecting section GA, and a postprocessing section POST. Each of the extension circuits c0 and c1 includes multiple logic sections L. Functions of the logic sections L included in the basic circuits C0 and C1 and functions of the logic sections L included in the extension circuits c0 and c1 are the same. For example, when the extension circuit C0 is coupled to the basic circuit C0, task C processing performance of the logic sections L of the basic and extension circuits C0 and c0 is twice as high as task C processing performance of the single basic circuit C0.

The preprocessing sections PRE of the basic circuits C0 and C1 execute preprocessing over data transferred via the coupling interfaces IF2 and output the data to the dispatchers DP. The dispatchers DP of the basic circuits C0 and C1 allocate the data transferred from the preprocessing sections PRE to the logic sections L of the basic circuits C0 and C1. For example, when the extension circuit c0 is coupled to the basic circuit C0, the dispatcher DP of the basic circuit C0 allocates data to be processed to the logic sections L of the extension circuit c0. The logic sections L of the basic circuits C0 and C1 execute data processing such as arithmetic processing and output results of executing the data processing to the collecting sections GA of the basic circuits C0 and C1. The collecting sections GA collect the execution results from the logic sections L and transfer the execution results to the postprocessing sections POST. For example, when the extension circuit c0 is coupled to the basic circuit C0, the collecting section GA of the basic circuit C0 collects execution results including a result of execution by the extension circuit c0. The postprocessing sections POST execute postprocessing based on the execution results and output information obtained by the postprocessing to the coupling interfaces IF2.

Each of basic circuits D0 and D1 is installed using two reconfigurable regions PRR adjacent to each other in the horizontal direction, while each of extension circuits d0 and d1 is installed using one reconfigurable region PRR. Each of the basic circuits D0 and D1 includes a dispatcher DP, multiple logic sections L, and a collecting section GA. Each of the extension circuits d0 and d1 includes multiple logic sections L. Functions of the dispatchers DP and collecting sections GA included in the basic circuits D0 and D1 are the same as or similar to the functions of the dispatchers DP and collecting sections GA included in the basic circuits C0 and C1. Functions of the logic sections L included in the basic circuits D0 and D1 and functions of the logic sections L included in the extension circuits d0 and d1 are the same. For example, when the extension circuit d0 is coupled to the basic circuit D0, task D processing performance of the logic sections L of the basic and extension circuits D0 and d0 is 1.5 times as high as task D processing performance of the single basic circuit D0. The functions of the logic sections L of the basic circuits D0 and D1 and the functions of the logic sections L of the extension circuits d0 and d1 are different from the functions of the logic sections L of the basic circuits C0 and C1 and the functions of the logic sections L of the extension circuits c0 and c1.

The basic circuits C0, C1, D0, and D1 are an example of the first circuits. The extension circuits c0, c1, d0, and d1 are an example of the second circuits. A preprocessing section PRE, a dispatcher DP, multiple logic sections L, a collecting section GA, and a postprocessing section POST that are included in each of the basic circuits C0, C1, D0, and D1 are an example of the first processing section for executing the first process. Multiple logic sections L that are included in each of the extension circuits c0, c1, d0, and d1 are an example of the second processing section for executing the first process.

Each of input and output sections IO included in the basic circuits C0, C1, D0, and D1 and to be coupled to the extension circuits c0, c1, d0, and d1 is an example of the first input and output section. The positions of the input and output sections IO, which are included in the basic circuit C0 and to be coupled to the extension circuit c0, are different from the positions of the input and output sections IO, which are included in the basic circuit C1 and to be coupled to the extension circuit c1. The positions of the input and output sections IO, which are included in the basic circuit D0 and to be coupled to the extension circuit d0, are different from the positions of the input and output sections IO, which are included in the basic circuit D1 and to be coupled to the extension circuit d1. Each of input and output sections IO included in the extension circuits c0, c1, d0, and d1 and to be coupled to the basic circuits C0, C1, D0, and D1 are an example of the second input and output section.

Figure 8:
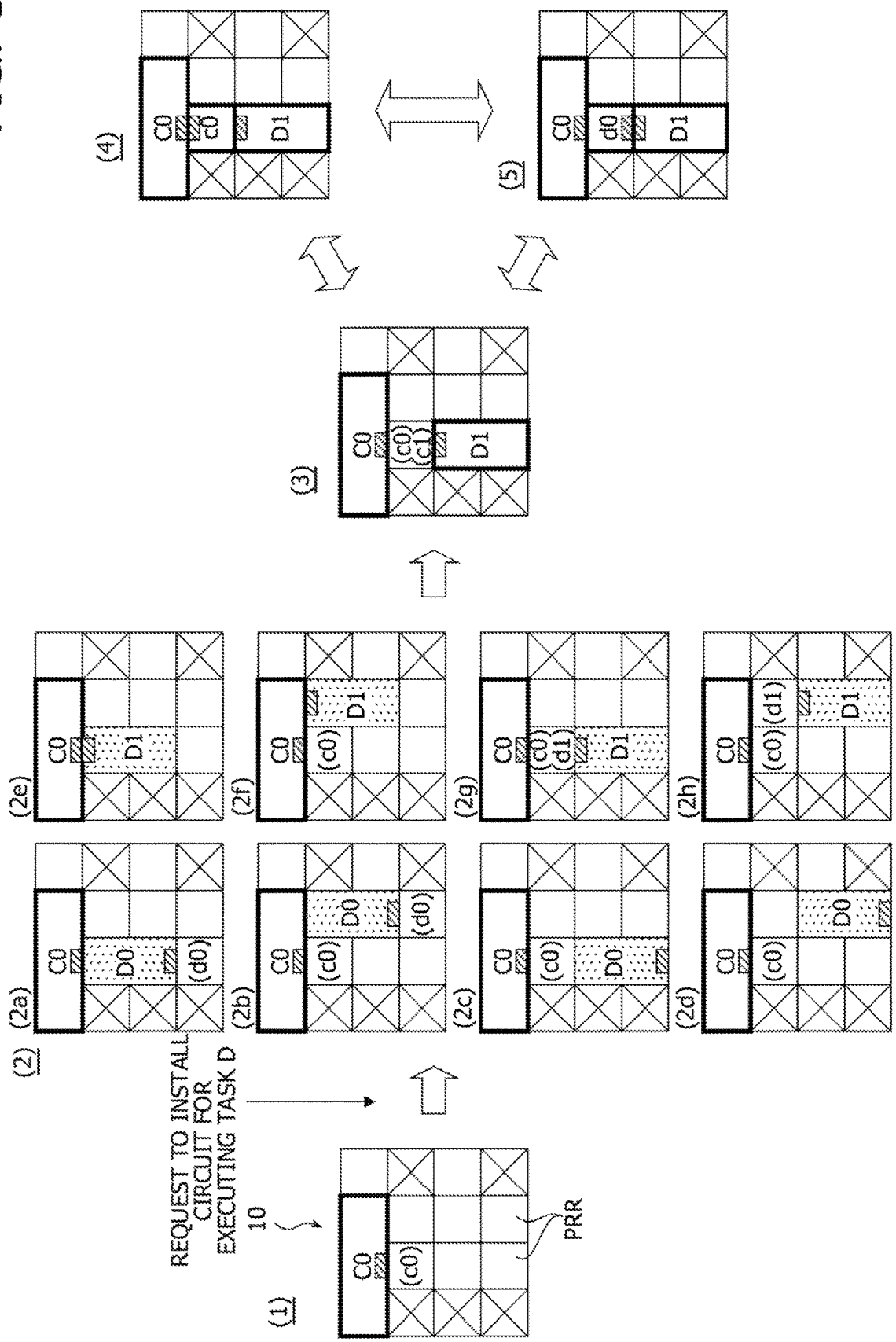
FIG. 8 illustrates an example of operations of the information processing apparatus illustrated in FIG. 5.

FIG. 8 illustrates an example of operations of the information processing apparatus 100A illustrated in FIG. 5. FIG. 8 illustrates an example of a method for controlling the information processing apparatus 100A. Other basic circuits are already installed in reconfigurable regions PRR indicated by symbols X. A new circuit is installable in each of eight reconfigurable regions PRR (available regions) indicated by white quadrangles. In FIG. 8, each of the input and output sections IO that couple the basic circuits to the extension circuits is indicated by a single rectangle with diagonal lines.

In a state indicated by (1) in FIG. 8, the basic circuit C0 is already installed in the programmable section 10. When a load of the task C increases and the task C processing performance of the basic circuit C0 is insufficient, a reconfigurable region PRR indicated by a symbol "(c0)" indicates that the extension circuit c0 may be coupled to the basic circuit C0. A reconfigurable region PRR in which the extension circuit c0 may be installed is included in the available regions. The available regions are reconfigurable regions PRR in which a basic circuit is not installed. In FIG. 8, the installed basic circuit C0 is an example of a third circuit for executing a second process, and the extension circuit c0 is an example of a fourth circuit for executing the second process. The reconfigurable region PRR in which the extension circuit c0 may be installed is an example of a reserved region.

In the state indicated by (1) in FIG. 8, a request to install a circuit for executing a process of the task D is issued. The extracting section 32 illustrated in FIG. 5 extracts, for the basic circuits D0 and D1, reconfigurable regions PRR (installable regions) in which the basic circuits D0 and D1 are installable from the eight reconfigurable regions PRR in which a circuit is not installed. When each of the basic circuit D0 and D1 is installed using one reconfigurable region PRR in the same manner as the extension circuit c0, the extracting section 32 extracts all the eight reconfigurable regions PRR as installable regions for each of the basic circuits D0 and D1.

(2) illustrated in FIG. 8 indicates installation patterns of installable regions (hatched regions) extracted by the extracting section 32. Since each of the basic circuits D0 and D1 is installed using two reconfigurable regions PRR adjacent to each other in the vertical direction, the extracting section 32 extracts eight installation patterns indicated by (2a) to (2h).

The first determining section 34 illustrated in FIG. 5 determines, for each of the four installation patterns (2a), (2b) (2c), and (2d), whether the extension circuit d0 may be coupled to the basic circuit D0. In addition, the first determining section 34 illustrated in FIG. 5 determines, for each of the four installation patterns (2e), (2f), (2g), and (2h), whether the extension circuit d1 may be coupled to the basic circuit D1.

The first determining section 34 determines that the extension circuit d0 may be coupled to the basic circuit D0 when the basic circuit D0 is installed in installable regions indicated in each of the installation patterns (2a) and (2b). The first determining section 34 determines that the extension circuit c0 is not installable due to the installation of the basic circuit D0 in the installation pattern (2a). The first determining section 34 determines that the extension circuit d0 may not be coupled to the basic circuit D0 when the basic circuit D0 is installed in installable regions indicated in each of the installation patterns (2c) and (2d).

The first determining section 34 determines that the extension circuit d1 may not be coupled to the basic circuit D1 when the basic circuit D1 is installed in installable regions indicated in each of the installation patterns (2e) and (2f). The first determining section 34 determines that the extension circuit c0 is not installable due to the installation of the basic circuit D1 in the installation pattern (2e). The first determining section 34 determines that the extension circuit d1 may be coupled to the basic circuit D1 when the basic circuit D1 is installed in installable regions indicated in each of the installation patterns (2g) and (2h).

The second determining section 36 illustrated in FIG. 5 excludes, from choices for a pattern to be selected, the installation pattern (2a) in which the basic circuit D0 overlaps the extension circuit c0 and the installation pattern (2e) in which the basic circuit D1 overlaps the extension circuit c0. For example, when another installation pattern in which the basic circuit D0 (or D1) is installable and does not overlap the extension circuit c0 exists, the second determining section 36 determines that the basic circuit D0 (or D1) is not installed in installable regions indicated in each of the installation patterns (2a) and (2e). Thus, when the task C processing performance of the basic circuit C0 decreases, the extension circuit c0 may be installed in the programmable section 10, and the basic circuit C0 and the extension circuit c0 may execute the task C in parallel.

Next, the second determining section 36 excludes, from choices for the pattern to be selected, the installation patterns (2c) and (2d) in which the extension circuit d0 is not installable and the installation pattern (2f) in which the extension circuit d1 is not installable. For example, when another installation pattern in which the extension circuit d0 (or d1) is installable exists, the second determining section 36 determines that the basic circuit D0 is not installed in installable regions indicated in each of the installation patterns (2c) and (2d) and that the basic circuit D1 is not installed in the installable regions indicated in the installation pattern (2f). Thus, when a load of the task D increases and the task D processing performance of the basic circuit D0 (or D1) is insufficient, the extension circuit d0 (or d1) may be installed to increase the task D processing performance.

The second determining section 36 selects, from among the installation patterns (2b), (2g), and (2h) that are not excluded from choices for the pattern to be selected, an installation pattern in which the task C processing performance and the task D processing performance are maximized using the minimum number of reconfigurable regions PRR. In each of the installation patterns (2b) and (2h), the extension circuits c0 and d0 (or d1) are installable so that the extension circuits c0 and d0 (or d1) do not share a reconfigurable region PRR. However, in each of the installation patterns (2b) and (2h), when the extension circuits c0 and d0 (or d1) are installed, the number of available reconfigurable regions PRR is smaller, compared with the other installation pattern (2g).

In the installation pattern (2g), a single reconfigurable region PRR may be shared by the extension circuits c0 and d1, and the number of reconfigurable regions PRR to be used to execute the tasks C and D may be minimized. Thus, the number of available reconfigurable regions PRR to be secured to execute another task may be maximized. Thus, as indicated by (3) in FIG. 8, the second determining section 36 determines that the basic circuit D1 is installed in the installable regions indicated in the installation pattern (2g). Then, a process of the task C and the process of the task D are executed using the programmable section 10. It is desirable to select the installation pattern (2g) when it is expected that the frequency with which one or more extension circuits are additionally installed for one or both of the tasks C and D executed by the programmable section 10 is lower than a predetermined threshold.

When it is expected that the frequency with which extension circuits are additionally installed for both the tasks C and D is higher than the predetermined threshold, the second determining section 36 may determine that the basic circuit D0 or the basic circuit D1 is installed in the installable regions indicated in the installation pattern (2b) or the installable regions indicated in the installation pattern (2h). In other words, the second determining section 36 may install the basic circuit D0 (or D1) so that a reconfigurable region PRR in which the extension circuit c0 is installed does not overlap a reconfigurable region PRR in which the extension circuit d0 (or d1) is installed.

Whether an installation pattern in which a reconfigurable region PRR is shared by multiple extension circuits or an installation pattern in which a reconfigurable region PRR is not shared by multiple extension circuits is selected on a priority basis is determined based on specifications of a system built in the information processing apparatus 100A. An installation pattern to be selected on a priority basis may be changed based on characteristics of the tasks to be executed by the programmable section 10.

After that, when the load of the task C increases and the task C processing performance of the basic circuit C0 is insufficient, the extension circuit c0 is coupled to the basic circuit C0, as indicated by (4) in FIG. 8. When the load of the task C decreases and the process of the task C is able to be executed by only the basic circuit C0 in the state indicated by (4) in FIG. 8, the state of the programmable section 10 returns to the state indicated by (3) in FIG. 8.

When the load of the task D increases and task D processing performance of the basic circuit D1 is insufficient, the extension circuit d1 is coupled to the basic circuit D1, as indicated by (5) in FIG. 8. When the load of the task D decreases and the process of the task D is able to be executed by only the basic circuit D1 in the state indicated by (5) in FIG. 8, the state of the programmable section 10 returns to the state indicated by (3) in FIG. 8. The state of the programmable section 10 may transition from the state indicated by (4) in FIG. 8 to the state indicated by (5) in FIG. 8 or transition from the state indicated by (5) in FIG. 8 to the state indicated by (4) in FIG. 8.

For example, an extension circuit is additionally installed when access made using a request to process a task and the like is intensified via the network NW illustrated in FIG. 5 and a task load temporarily increases. In addition, an extension circuit is additionally installed when the transfer of processing data from the arithmetic processing device 30 to the programmable section 10 is delayed due to an increase in a load applied to the arithmetic processing device 30 and the transfer of the processing data is restarted after the delay. Alternatively, an extension circuit is additionally installed when a virtual machine manages a task to be executed by the programmable section 10, and the programmable section 10 is switched to the information processing apparatus 100A due to live migration of the virtual machine so that the information processing apparatus 100A processes the task.

It is assumed that the extracting section 32 extracts only the installation pattern (2a) in which the basic circuit D0 overlaps the extension circuit c0 and the installation pattern (2e) in which the basic circuit D1 overlaps the extension circuit c0. In this case, the second determining section 36 determines that the basic circuit D0 (or D1) is installed in the installable regions indicated in the installation pattern (2a) (or (2e)). However, since the extension circuit d0 is installable in the installation pattern (2a), the task D processing performance in the installation pattern (2a) may be improved, compared with the task D processing performance in the installation pattern (2e). Thus, the second determining section 36 may determine that the basic circuit D0 is installed in the installable regions indicated in the installation pattern (2a).

In addition, it is assumed that the extracting section 32 extracts only the installation patterns (2c) and (2d) in which the extension circuit d0 is not installable and the installation pattern (2f) in which the extension circuit d1 is not installable. In this case, the second determining section 36 determines that the basic circuit D0 is installed in installable regions indicated in any of the installation pattern (2c) and (2d) or that the basic circuit D1 is installed in the installable regions indicated in the installation pattern (2f). When the extracting section 32 extracts only the installation patterns (2e) and (2f), it is desirable that the second determining section 36 select the installation pattern (2f) in which the extension circuit c0 is installable.

When the basic circuit D0 (or D1) is installable in reconfigurable regions PRR among the reconfigurable regions PRR, the processing performance may be improved by using the programmable section 10 to execute the task D, compared with the case where the task D is executed by the software.

Figure 9:
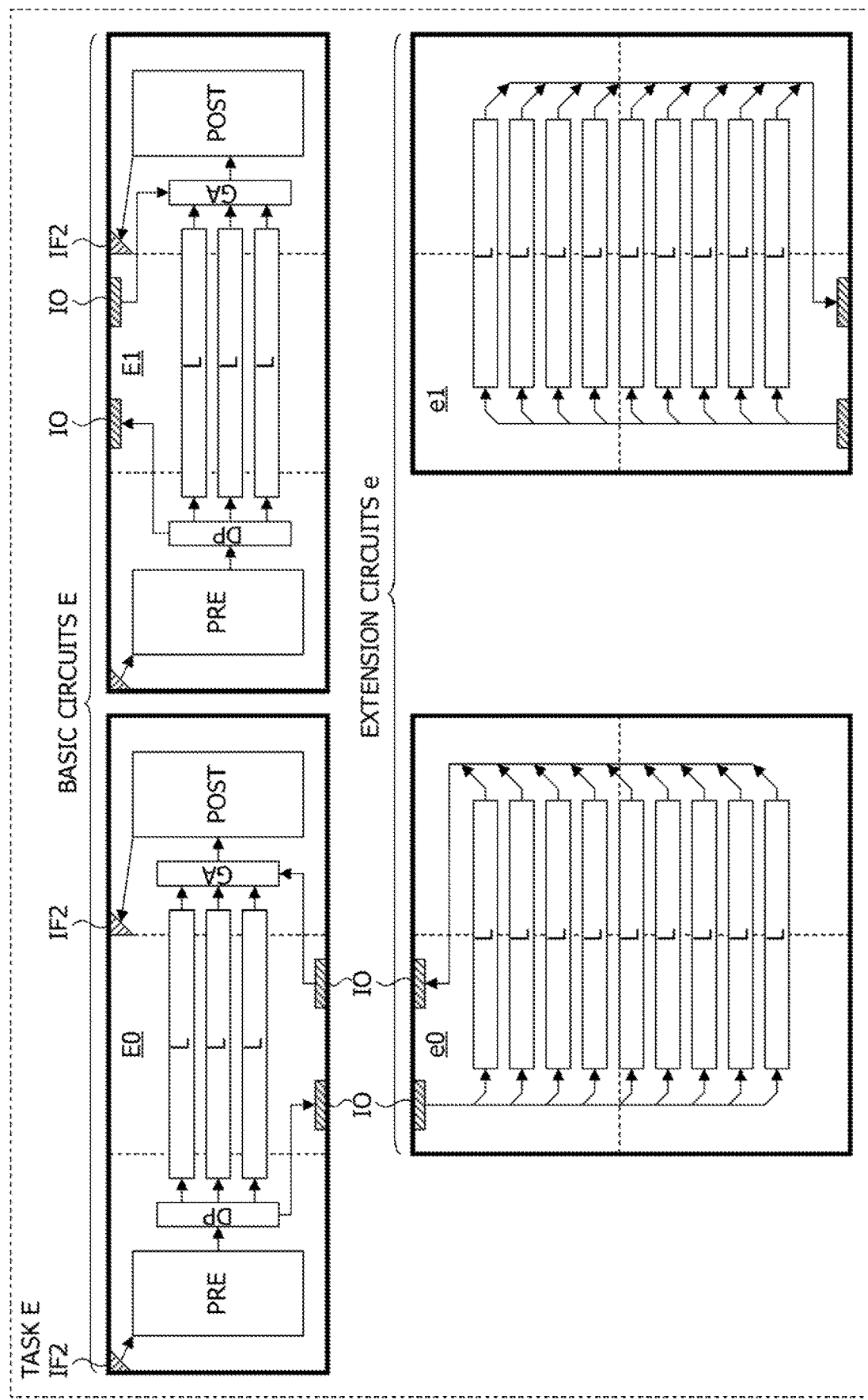
FIG. 9 illustrates another example of the configuration information stored in the main memory illustrated in FIG. 5.

FIG. 9 illustrates another example of the configuration information stored in the main memory 40 illustrated in FIG. 5. Components that are the same as or similar to those illustrated in FIG. 7 will not be described in detail. FIG. 9 omits illustration of the input and output sections IO (or lines extending across the common lines CW illustrated in FIG. 6) coupled to dedicated lines extending across the reconfigurable regions PRR.

In FIG. 9, each of basic circuits E (E0 and E1) for executing a task E is installed using three reconfigurable regions PRR adjacent to each other in the horizontal direction, and each of extension circuits e (e0 and e1) for executing the task E is installed using four reconfigurable regions PRR, which are two reconfigurable regions PRR adjacent to each other in the horizontal direction and two reconfigurable regions PRR adjacent to each other in the vertical direction. The extension circuit e0 may be coupled to the basic circuit E0. The extension circuit e1 may be coupled to the basic circuit E1.

Logic of logical sections L of each of the basic circuits E0 and E1 is installed across three reconfigurable regions PRR, while logic of logical sections L of each of the extension circuits e0 and e1 is installed across four reconfigurable regions PRR. The task E is executed by the basic circuit E0, or the basic circuit E1, or the basic circuit E0 and the extension circuit e0, or the basic circuit E1 and the extension circuit e1. For example, when any of the extension circuits e is coupled to a corresponding one of the basic circuits E, task E processing performance of logic sections L of the basic circuit E and the extension circuit e is four times as high as task E processing performance of the single basic circuit E.

Figure 10:
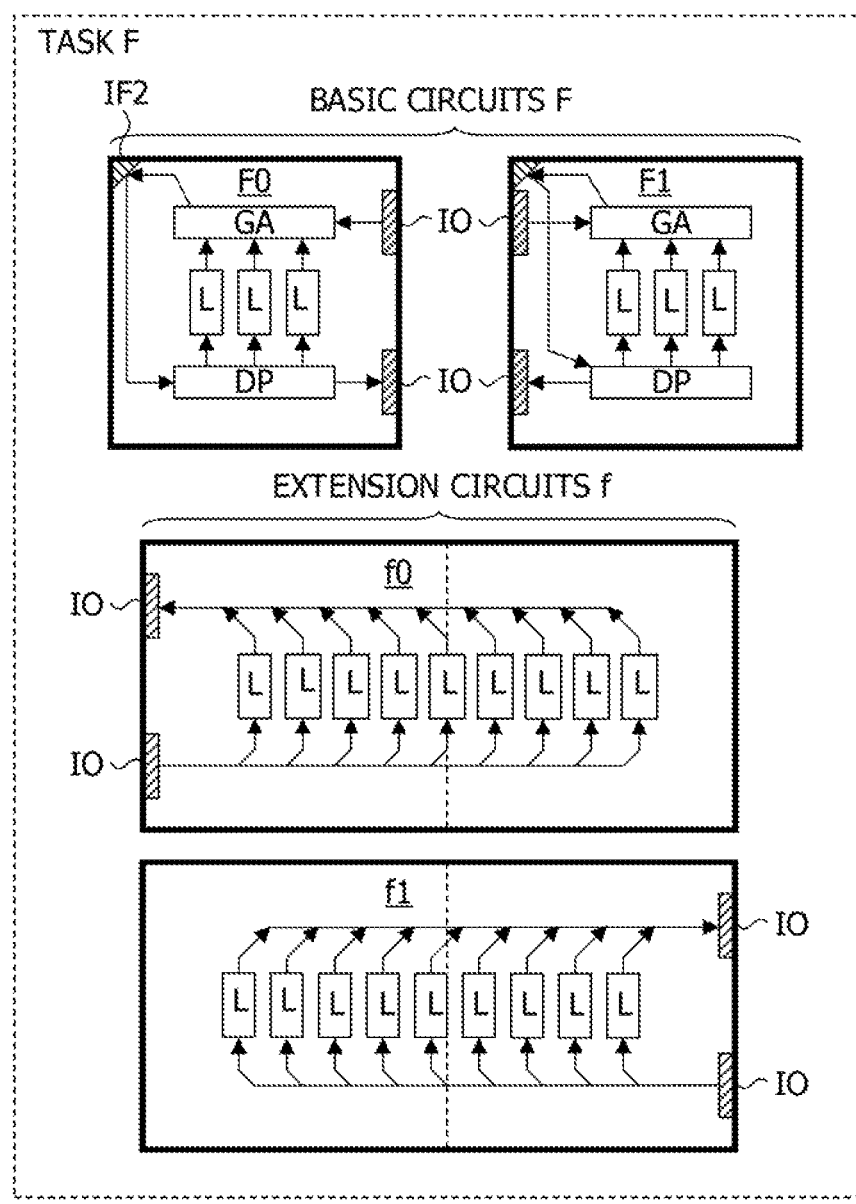
FIG. 10 illustrates another example of the configuration information stored in the main memory illustrated in FIG. 5.

FIG. 10 illustrates another example of the configuration information stored in the main memory 40 illustrated in FIG. 5. Components that are the same as or similar to those illustrated in FIG. 7 will not be described in detail. FIG. 10 also omits illustration of input and output sections IO coupled to dedicated lines extending across the reconfigurable regions PRR.

In FIG. 10, each of basic circuits F (F0 and F1) is installed using one reconfigurable region PRR, while each of extension circuits f (f0 and f1) is installed using two reconfigurable regions PRR adjacent to each other in the horizontal direction. The extension circuit f0 may be coupled to the basic circuit f0. The extension circuit f1 may be coupled to the basic circuit F1. For example, when any of the extension circuits f is coupled to a corresponding one of the basic circuits F, task F processing performance of logic sections L of the basic circuit F and the extension circuit e is four times as high as task F processing performance of the single basic circuit F.

Figure 11:
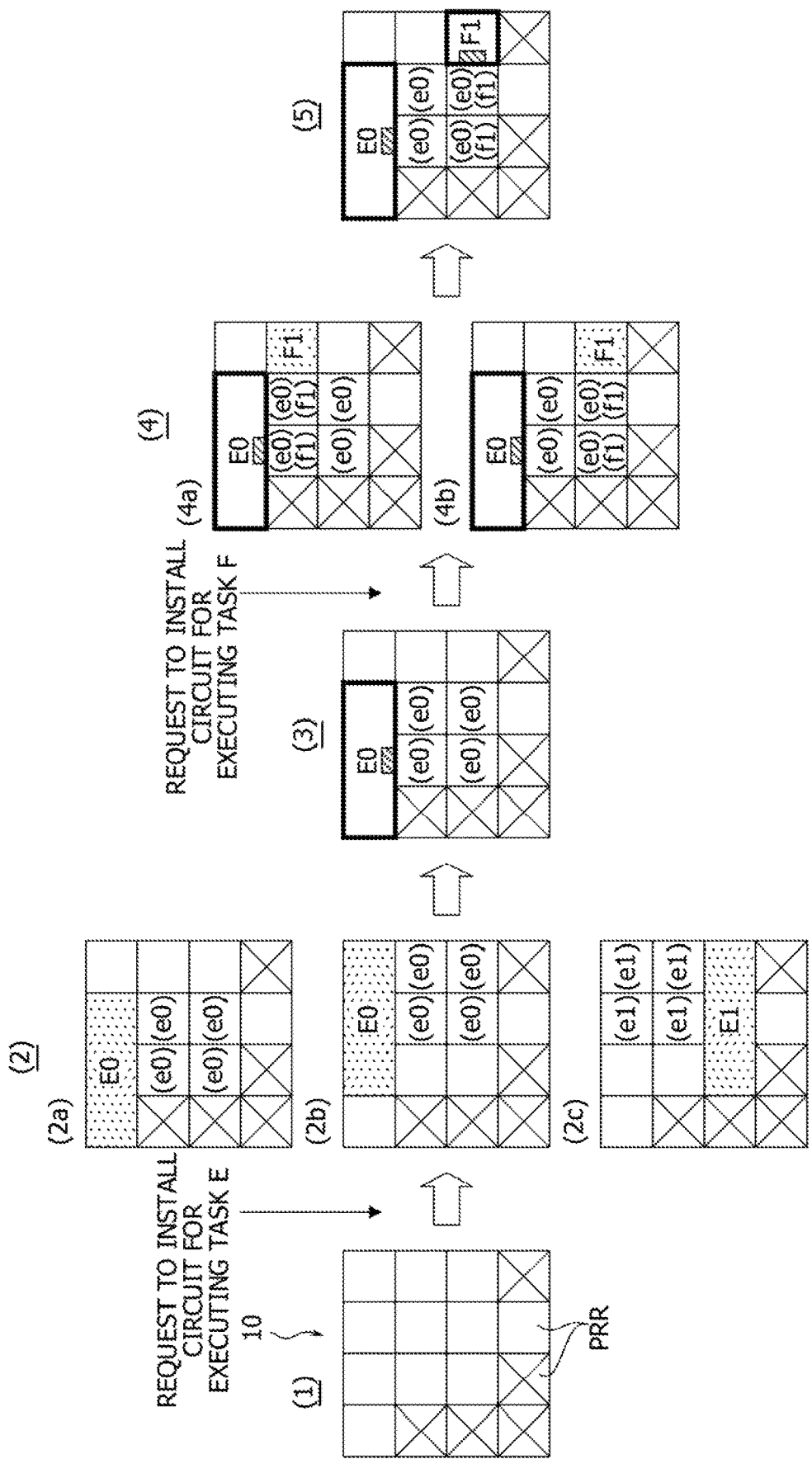
FIG. 11 illustrates another example of the operations of the information processing apparatus illustrated in FIG. 5.

FIG. 11 illustrates an example of the operations of the information processing apparatus 100A illustrated in FIG. 5. FIG. 11 illustrates an example of the method for controlling the information processing apparatus 100A. Components that are the same as or similar to those illustrated in FIG. 8 will not be described in detail.

In a state indicated by (1) in FIG. 11, basic circuits and the like are already installed in reconfigurable regions PRR indicated by symbols X in the programmable section 10, and eleven reconfigurable regions PRR indicated by white quadranges are available. In the state indicated by (1) in FIG. 11, a request to install a circuit for executing a process of the task E is issued.

The extracting section 32 illustrated in FIG. 5 extracts reconfigurable regions PRR (installable regions) in which the basic circuits E0 and E1 illustrated in FIG. 9 are installable from the eleven reconfigurable regions PRR in which a circuit is not installed. (2) illustrated in FIG. 11 indicates installation patterns of the installable regions (hatched regions) extracted by the extracting section 32. (2) illustrated in FIG. 11 indicates only the installation patterns in which the basic circuit E0 (or E1) and the extension circuit e0 (or e1) are installable, and omits illustration of installation patterns in which the extension circuit e0 or e1 is not installable due to the installation of the basic circuit E0 or E1. In other words, (2) illustrated in FIG. 11 indicates the installation patterns determined by the first determining section 34 illustrated in FIG. 5 to be patterns in which the extension circuit e0 (or e1) may be coupled to the basic circuit E0 (or E1).

In installation patterns (2a), (2b), and (2c) indicate by (2) in FIG. 11, the numbers of reconfigurable regions PRR used to install the basic circuit E0 (or E1) are the same. Thus, the second determining section 36 illustrated in FIG. 5 selects, from among installable regions indicated in the installation patterns (2a), (2b), and (2c), installable regions in which the number of available regions, which are adjacent to each other and to be secured after the installation of the basic circuit E0 (or E1), is the largest. Thus, as indicated by (3) in FIG. 11, the second determining section 36 determines that the basic circuit E0 is installed in the installable regions indicated in the installation pattern (2a). The second determining section 36 does not select an installation pattern (not illustrated) that is not the installation patterns (2a), (2b), and (2c) and includes installable regions in which the extension circuit e0 (or e1) is not installable.

In a state indicated by (3) in FIG. 11, a request to install a circuit for executing a process of the task F is issued. The extracting section 32 extracts reconfigurable regions PRR (installable regions) in which the basic circuits F0 and F1 are installable from eight reconfigurable regions PRR in which a circuit is not installed. (4) illustrated in FIG. 11 indicates the installable regions (hatched regions) extracted by the extracting section 32. (4) illustrated in FIG. 11 indicates only installable regions determined by the first determining section 34 to be regions in which the extension circuit f0 (or f1) may be coupled to the basic circuit F0 (or F1) installable at positions where the basic circuit F0 (or F1) does not overlap the extension circuit e0.

The second determining section 36 selects, from among installable regions indicated in installation patterns (4a) and (4b) indicated by (4) in FIG. 11, installable regions in which the number of available regions, which are adjacent to each other and to be secured after the installation of the basic circuit F1, is the largest. Thus, as indicated by (5) in FIG. 11, the second determining section 36 determines that the basic circuit F1 is installed in the installable region indicated in the installation pattern (4b).

Figure 12:
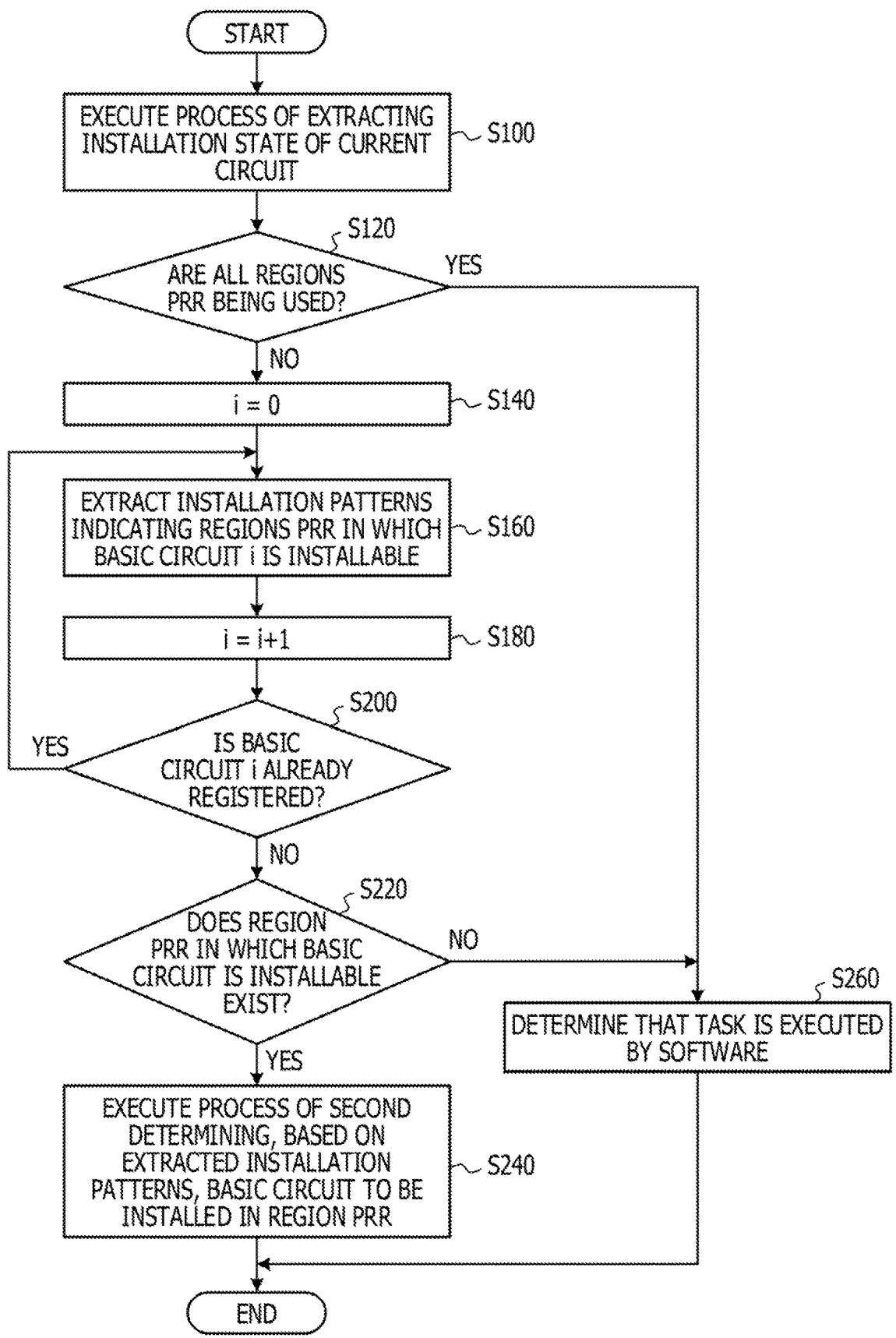
FIG. 12 illustrates an example of a process by a control program to be executed by the information processing apparatus illustrated in FIG. 5.

FIG. 12 illustrates an example of a process by the control program to be executed by the information processing apparatus 100A illustrated in FIG. 5. FIG. 12 illustrates an example of the method for controlling the information processing apparatus 100A. A process illustrated in FIG. 12 is started based on the issuance of a request to install a circuit for executing a task in the programmable section 10.

Figure 13:
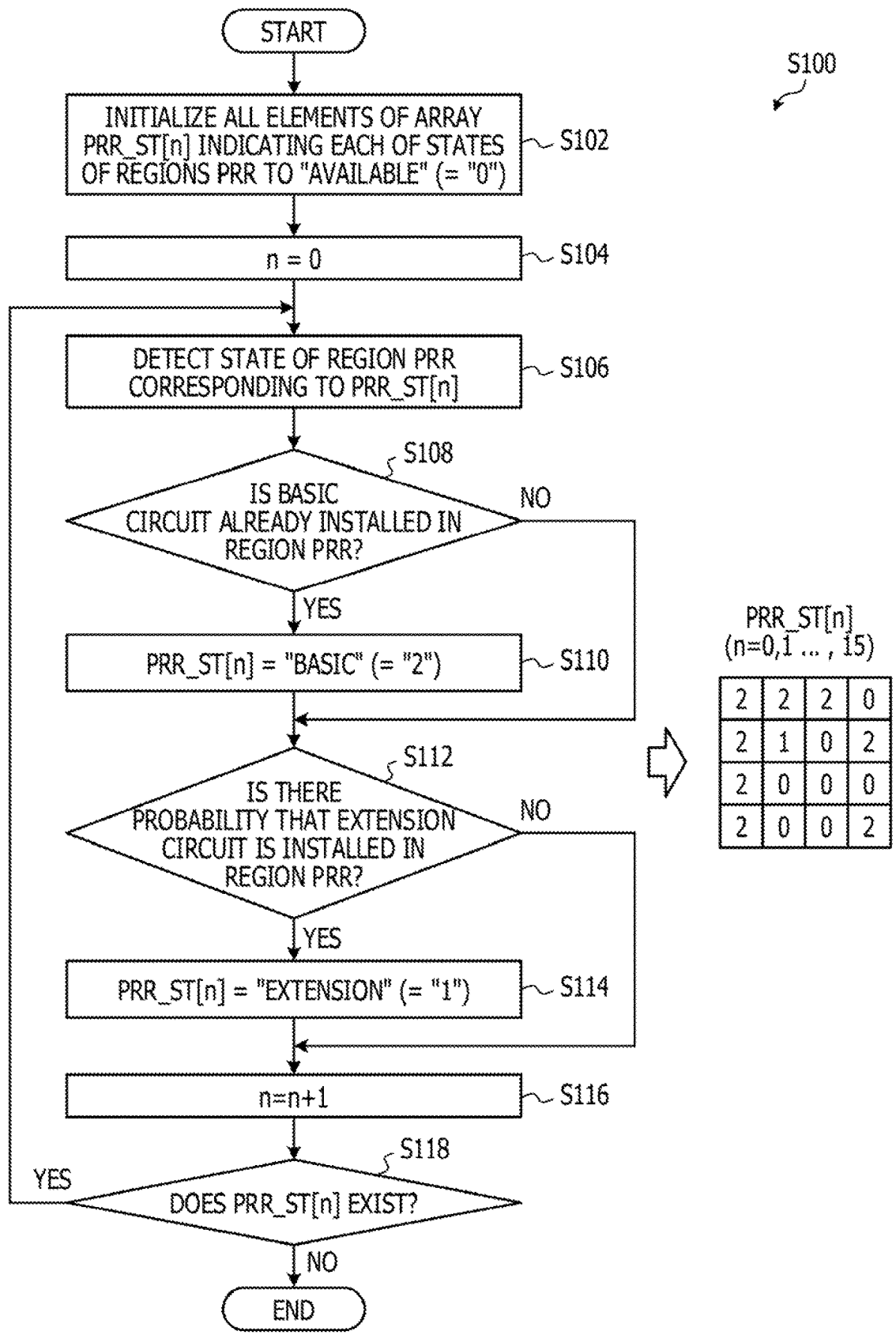
FIG. 13 illustrates an example of a process of step S100 illustrated in FIG. 12.

First, in step S100, the control program executes a process of extracting an installation state of a current circuit programmed in the programmable section 10. An example of the process of step S100 is illustrated in FIG. 13.

Next, in step S120, the control program determines whether all the reconfigurable regions PRR are being used. When all the reconfigurable regions PRR are being used, the process proceeds to step S260. When an available reconfigurable region PRR exists, the process proceeds to step S140.

In step S140, the control program initializes a variable i to "0". For example, as described with reference to FIG. 8, when a request to install a circuit for executing the task D illustrated in FIG. 7 is received, the variable i is sequentially set to "0" indicating the basic circuit D0 and to "1" indicating the basic circuit D1. Next, in step S160, the control program extracts installation patterns indicating reconfigurable regions PRR in which a basic circuit i (for example, D0 or D1) is installable. In step S180, the control program increments the variable i by "1".

In step S200, the control program determines whether configuration information of the basic circuit i is already registered in the main memory 40. When the configuration information of the basic circuit i is already registered in the main memory 40, the process returns to step S160 to extract an installation pattern indicating a reconfigurable region PRR in which a new basic circuit i is installable. When the configuration information of the basic circuit i is not registered in the main memory 40, the extraction of all installation patterns indicating reconfigurable regions PRR in which the basic circuit i is installable has been completed and the process proceeds to step S220.

For example, when the programmable section 10 is in a state indicated by (1) in FIG. 8, a request to install a circuit for executing the task D is received, and the variable i="0", the installation patterns (2a), (2b), (2c), and (2d) indicated by (2) in FIG. 8 are extracted. When the variable i="1", the installation patterns (2e), (2f), (2g), and (2h) indicated by (2) in FIG. 8 are extracted.

In step S220, the control program determines, based on results of extracting the installable reconfigurable regions PRR in step S160, whether a reconfigurable region PRR in which any of the basic circuits is installable exists. When the reconfigurable region PRR in which any of the basic circuits is installable exists, the process proceeds to step S240 to determine a reconfigurable region PRR in which the basic circuit is to be installed. When the reconfigurable region PRR in which any of the basic circuits is installable does not exist, the basic circuit is not installable in any reconfigurable region PRR and the process proceeds to step S260.

Figure 14:
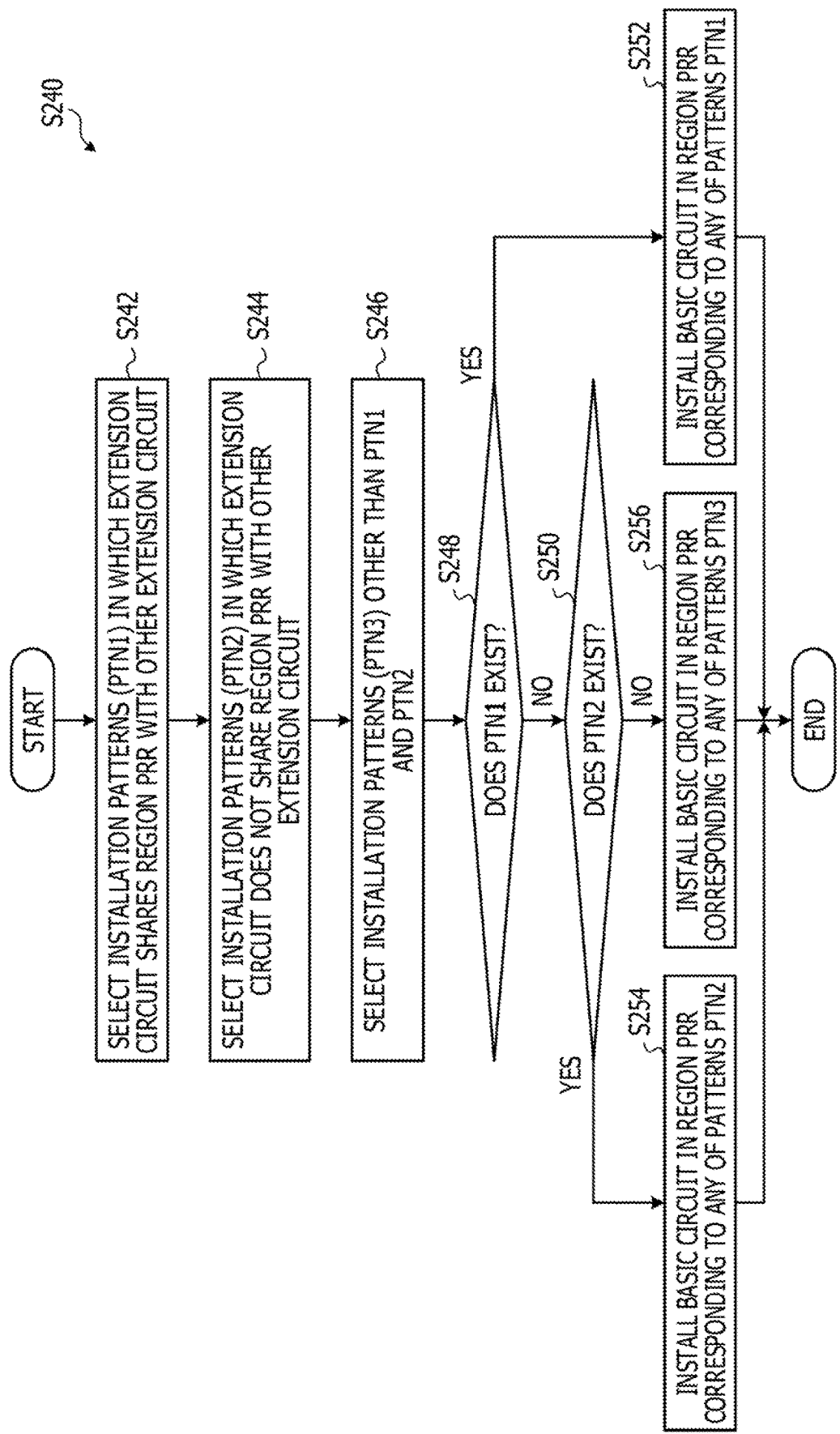
FIG. 14 illustrates an example of a process of step S240 illustrate in FIG. 12.

In step S240, the control program executes, based on the installation patterns extracted in step S160, a process of determining the basic circuit to be installed in a reconfigurable region PRR among the reconfigurable regions PRR and terminates the process. An example of the process of step S240 is illustrated in FIG. 14. When the reconfigurable region PRR in which any of the basic circuits is installable does not exist, the control program determines that the task is executed by the software such as the application program in step S260. After step S260, the control program terminates the process.

FIG. 13 illustrates an example of the process of step S100 illustrated in FIG. 12. First, in step S102, the control program initializes all elements of an array PRR_ST[n] storing information indicating each of states of the reconfigurable regions PRR to "available" (for example, "0"). For example, in the case where the programmable section 10 includes the sixteen reconfigurable regions PRR, "n" is any of values of "0" to "15".

In step S104, the control program initializes a variable n to "0". In step S106, the control program detects a current state of an n-th reconfigurable region PRR corresponding to the array PRR_ST[n]. When a basic circuit is already installed in the n-th reconfigurable region PRR in step S108, the control program causes the process to proceed to step S110. When the basic circuit is not installed in the n-th reconfigurable region PRR in step S108, the control program causes the process to proceed to step S112.

In step S110, the control program causes "basic" (for example, "2"), which indicates that the basic circuit is already installed in the reconfigurable region PRR, to be stored in the array PRR_ST[n]. When there is a probability that an extension circuit is installed in the n-th reconfigurable region PRR based on the installed basic circuit in step S112, the control program causes the process to proceed to step S114. When there is no probability that an extension circuit is installed in the n-th reconfigurable region PRR based on the installed basic circuit in step S112, the control program causes the process to proceed to step S116.

In step S114, the control program causes "extension" (for example, "1"), which indicates that there is a probability that an extension circuit is installed in the reconfigurable region PRR, to be stored in the array PRR_ST[n] and causes the process to proceed to step S116. In step S116, the control program increments the variable n by "1". In step S118, the control program determines whether the array PRR_ST[n] exists. When the array PRR_ST[n] exists, the control program causes the process to return to step S106 to store the state of the reconfigurable region PRR in the array PRR_ST[n]. When the array PRR_ST[n] does not exist, information indicating installation states of circuits has been stored in all the elements of the array PRR_ST[0] to PRR_ST[15], and the process is terminated.

The array PRR_ST[n] illustrated over the right side of FIG. 13 indicates the state, indicated by (1) in FIG. 8, of the programmable section 10. In order to easily understand the description, FIG. 13 illustrates the two-dimensional array PRR_ST[n] based on the layout of the reconfigurable regions PRR of the programmable section 10. In step S160 illustrated in FIG. 12, reconfigurable regions PRR in which a basic circuit is installable are extracted from reconfigurable regions PRR corresponding to elements included in the array PRR_ST[n] and storing "0" or "1".

FIG. 14 illustrates an example of the process of step S240 illustrated in FIG. 12. The control program determines, based on the installation patterns (for example, (2a) to (2h) illustrated in FIG. 8) extracted in step S160 illustrated in FIG. 12, a basic circuit to be installed in the programmable section 10 and the position of a reconfigurable region PRR in which the basic circuit is to be installed.

In step S242, the control program selects, as first patterns PTN1 from among the installation patterns extracted in step S160, installation patterns in which an extension circuit to be coupled to the basic circuit and another extension circuit share a reconfigurable region PRR. Next, in step S244, the control program selects, as second patterns PTN2 from among the installation patterns extracted in step S160, installation patterns in which the extension circuit to be coupled to the basic circuit and another extension circuit do not share a reconfigurable region PRR. In the installation pattern (2a) illustrated in FIG. 8, the extension circuit d0 and the extension circuit c0 to be coupled to the basic circuit C0 do not share a reconfigurable region PRR, and the extension circuit c0 is not installable due to the installation of the basic circuit D0. Thus, the installation pattern (2a) is not selected as a second pattern PTN2.

Next, in step S246, the control program selects, as third patterns PTN3 from among the installation patterns extracted in step S160 illustrated in FIG. 12, installation patterns that are neither the first patterns PTN1 nor the second patterns PTN2. In step S248, when an installation pattern selected as a first pattern PTN1 exists, the control program causes the process to proceed to step S252. In step S248, when the installation pattern selected as the first pattern PTN1 does not exist, the control program causes the process to proceed to step S250. In step S250, when an installation pattern selected as a second pattern PTN2 exists, the control program causes the process to proceed to step S254. In step S250, when the installation pattern selected as the second pattern PTN2 does not exist, the control program causes the process to proceed to step S256.

In step S252, the control program installs the basic circuit in a reconfigurable region PRR corresponding to any of the installation patterns selected as the first patterns PTN1. After step S252, the control program terminates the process. In step S254, the control program installs the basic circuit in a reconfigurable region PRR corresponding to any of the installation patterns selected as the second patterns PTN2. After step S254, the control program terminates the process. In step S256, the control program installs the basic circuit in a reconfigurable region PRR corresponding to any of the installation patterns selected as the third patterns PTN3. After step S256, the control program terminates the process.

When an installation pattern in which an extension circuit to be coupled to the basic circuit and another extension circuit do not share a reconfigurable region PRR is used on a priority basis, or when the patterns PTN2 are prioritized over the patterns PTN1, the determination of step S250 is executed before step S248.

Figure 15:
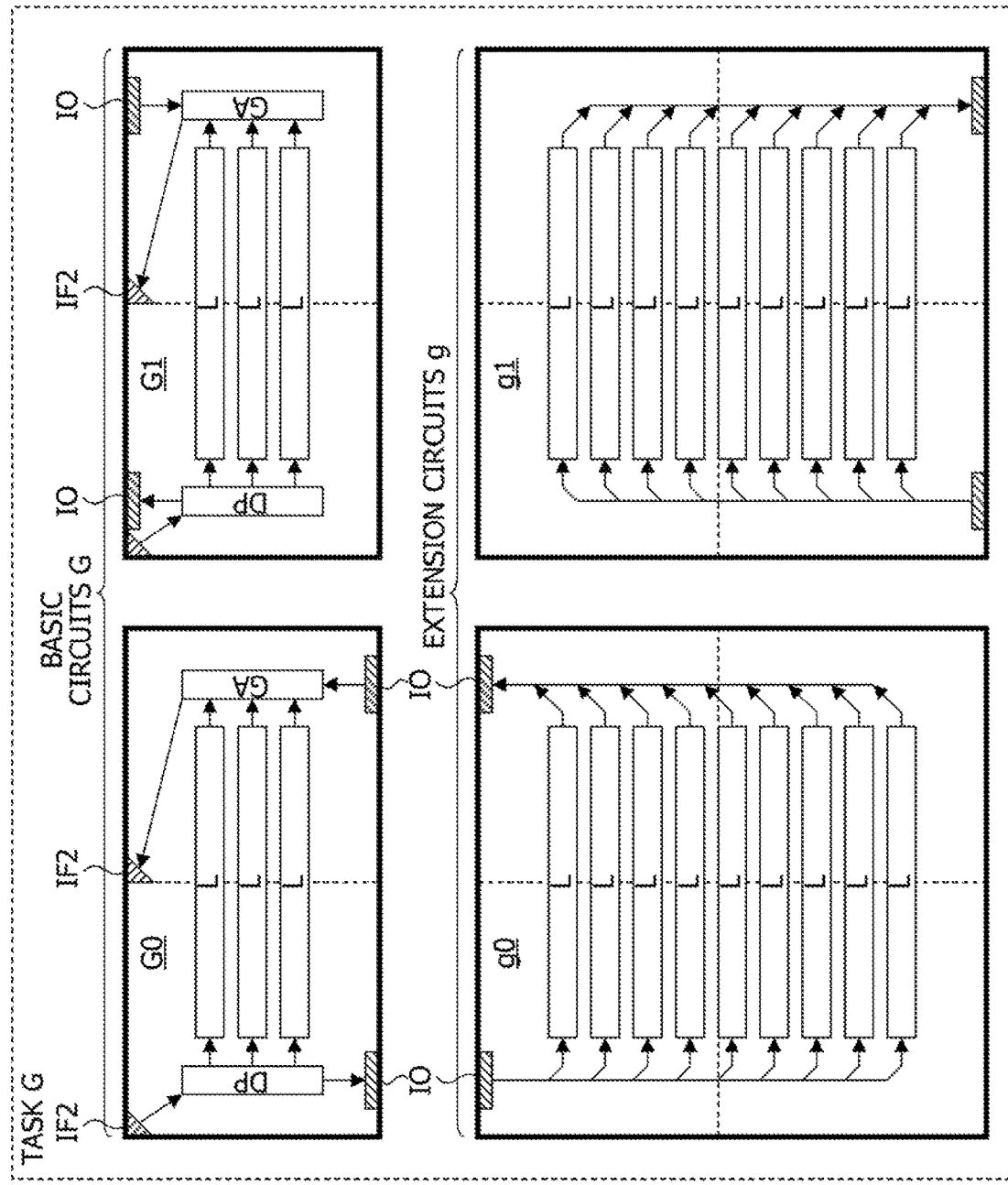
FIG. 15 illustrates another example of the configuration information stored in the main memory illustrated in FIG. 5.

FIG. 15 illustrates another example of the configuration information stored in the main memory 40 illustrated in FIG. 5. Components that are the same as or similar to those illustrated in FIGS. 7 and 9 will not be described in detail.

In FIG. 15, each of basic circuits G (G0 and G1) for executing a task G is installed using two reconfigurable regions PRR adjacent to each other in the horizontal direction, and each of extension circuits g (g0 and g1) for executing the task G is installed using four reconfigurable regions PRR, which are two reconfigurable regions PRR adjacent to each other in the horizontal direction and two reconfigurable regions PRR adjacent to each other in the vertical direction. The extension circuit g0 may be coupled to the basic circuit G0. The extension circuit g1 may be coupled to the basic circuit G1.

Logic of logical sections L of each of the basic circuits G is installed across two reconfigurable regions PRR, while logic of logical sections L of each of the extension circuits g is installed across four reconfigurable regions PRR. An input and output section IO for coupling a dispatcher DP of each basic circuit G to a corresponding extension circuit g is installed in a reconfigurable region PRR different from a reconfigurable region PRR in which an input and output section IO for coupling a collecting section GA of the basic circuit G to the extension circuit g is installed.

By installing two input and output sections IO for coupling each of the basic circuits G to a respective one of the extension circuits g in two reconfigurable regions PRR, a length of a line extending from a dispatcher DP or a collecting section GA to an input and output section IO in the basic circuit G may be minimized. In each of the extension circuits g, lengths of lines extending from input and output sections IO to logic sections L may be minimized.

On the other hand, as illustrated in FIG. 9, when two input and output sections IO for coupling each of the basic circuits E to a respective one of the extension circuits e are installed in one reconfigurable region PRR, a length of a line extending from a dispatcher DP or a collecting section GA to an input and output section IO in the basic circuit E is longer than that illustrated in FIG. 15. Similarly, lengths of lines extending from input and output sections IO to logic sections L in each of the extension circuit e are longer than those illustrated in FIG. 15.

Figure 16:
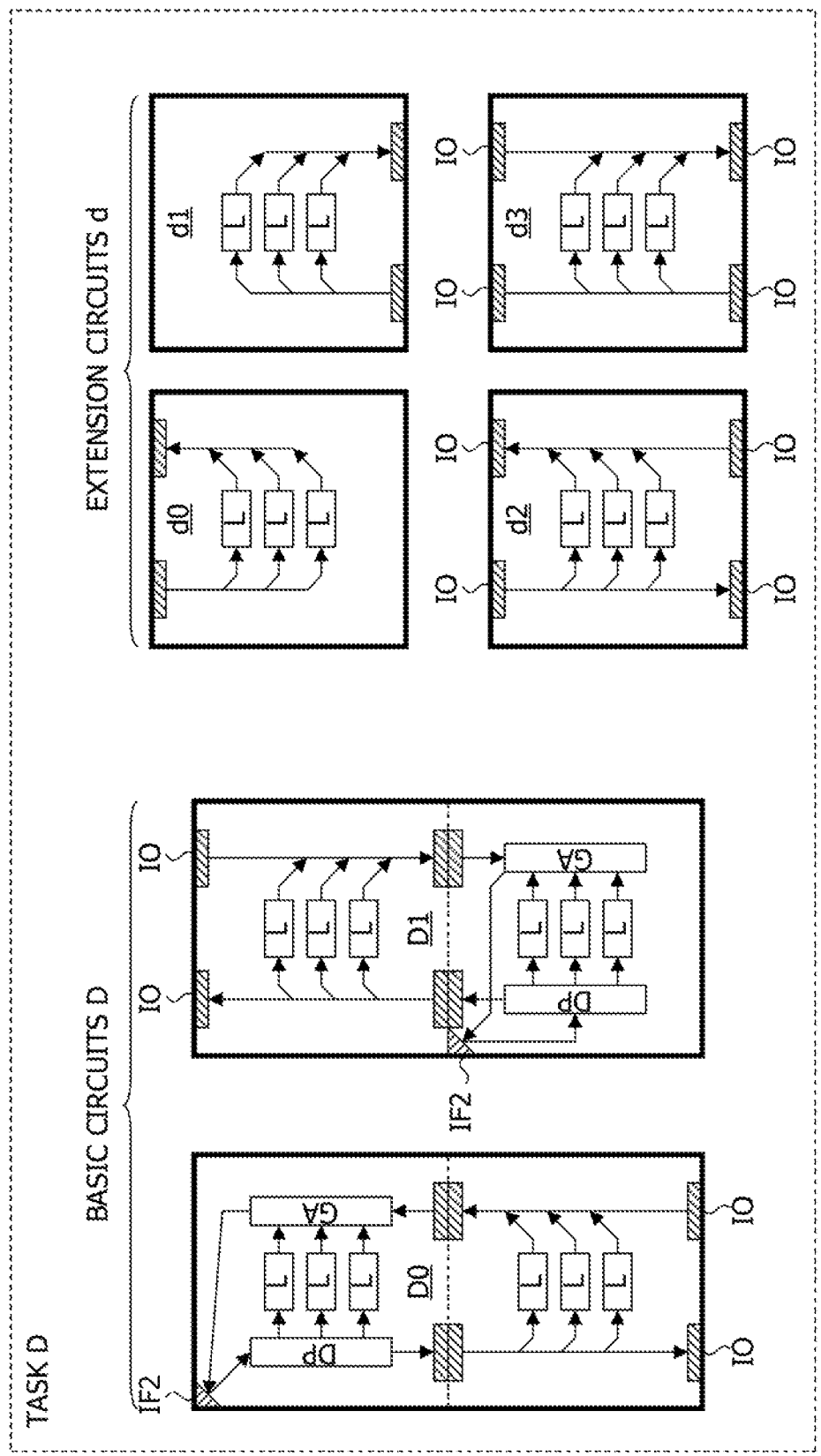
FIG. 16 illustrates an example of configuration information to be used to execute a task.

FIG. 16 illustrates an example of configuration information to be used to execute the task D. Components that are the same as or similar to those illustrated in FIG. 7 will not be described in detail. In FIG. 16, configuration information of extension circuits d2 and d3 is added to the configuration information to be used to execute the task D illustrated in FIG. 7.

The extension circuit d2 is installed between the basic circuit D0 and the extension circuit d0. The extension circuit d3 is installed between the basic circuit D1 and the extension circuit d1. For example, task D processing performance when only the extension circuit d0 is coupled to the basic circuit D0 is the same as task D processing performance when only the extension circuit d2 is coupled to the basic circuit D0. Thus, when the load of the task D increases, the extension circuit d2 is coupled to the basic circuit D0. When the load of the task D further increases, the extension circuit d0 is coupled to the extension circuit d2. The task D processing performance, therefore, may be adjusted in multiple stages based on an increase in the load.

For example, when the extension circuits d0 and d2 are coupled to the basic circuit D0, task D processing performance of the logic sections L of the basic circuit D0 and the extension circuits d0 and d2 is twice as high as the task D processing performance of only the single basic circuit D0. When five or more reconfigurable regions PRR are arranged in the vertical direction in the programmable section 10, multiple extension circuits d2 (or d3) may be coupled to the basic circuit D0 (or D1).

Thus, according to the embodiment described with reference to FIGS. 5 to 16, effects that are the same as or similar to those obtained in the embodiment described with reference to FIGS. 1 to 4 may be obtained. For example, when multiple basic circuits are prepared, which have input and output sections IO for coupling the basic circuits to extension circuits in different directions, the sizes of circuits of the input and output sections IO of the multiple basic circuits may be reduced, compared with basic circuits, each having multiple input and output sections IO and may be coupled to extension circuits in multiple directions. Thus, the sizes of circuits of the processing sections including the logic sections L may be relatively increased. Thus, the processing performance of the basic circuits may be improved, compared with the case where input and output sections IO are installed over two or more of each of the basic circuits. As a result, the frequency with which an extension circuit is additionally installed may be reduced, and the load of the arithmetic processing device 30 for controlling the installation of the extension circuits in the programmable section 10 may be reduced.

In the embodiment described with reference to FIGS. 5 to 16, by installing, in a reconfigurable region PRR, a basic circuit corresponding to an extension circuit that may share a reconfigurable region PRR with another extension circuit, the number of reconfigurable regions PRR to be used to execute tasks of multiple types may be minimized. Thus, the number of available reconfigurable regions PRR to be secured to execute another task may be maximized.

In addition, when each basic circuit, which corresponds to an extension circuit that is installable in a reconfigurable region PRR in which the extension circuit does not share a reconfigurable region PRR with another extension circuit, is installed in a reconfigurable region PRR, and processing performance of each basic circuit is insufficient, extension circuits may be installed. When a basic circuit is installed in a reconfigurable region PRR without overlapping another extension circuit, and processing performance of another basic circuit decreases, a task may be executed using the other extension circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. An information processing apparatus comprising:
a programmable circuit including a plurality of reconfigurable regions in which logic is reconfigurable; and
a processor coupled to the programmable circuit, the processor being configured to
execute an extraction process that includes extracting, from the plurality of reconfigurable regions, one or more installable regions in which any of a plurality of first circuits is installable; each of the plurality of first circuits including a first processing section for executing a first process and a first input and output section for receiving and outputting information; the each of the plurality of first circuits being configured so that the positions of the first input and output sections are different from each other when each of the plurality of first circuits is installed in any of the reconfigurable regions,
execute a first determination process that includes determining whether each of a plurality of second circuits is installable in a first reconfigurable region; the first reconfigurable region being adjacent to the one or more installable regions extracted by the extraction process; each of the plurality of second circuits including a second processing section for executing the first process and a second input and output section to be coupled to a first input and output section among the first input and output sections; each of the plurality of second circuits corresponding to any of the plurality of first circuits,
execute a second determination process that includes determining a first installation circuit and a first installation region based on the determination executed by the first determination process; the first installation circuit being among the plurality of first circuits and to be installed in the programmable circuit; the first installation region being a region that is among the one or more installable regions and in which the first installation circuit is to be installed, and
execute an installation process that includes installing the first installation circuit determined by the second deter- mination process in the first installation region determined by the second determination process.

2. The information processing apparatus according to claim 1,
wherein the second determination process is configured to determine the first installation region and the first installation circuit corresponding to a second circuit that is among the second circuits and is installable in a reserved region when a first requirement is satisfied, and
wherein the first requirement is configured to be satisfied when second process processing performance of a third circuit for executing a second process is insufficient, and when a reserved region that is a reconfigurable region in which a fourth circuit for executing the second process is installable exists adjacent to a reconfigurable region in which the third circuit is installed, and when the first determination process determines that any of the plurality of second circuits is installable in the reserved region.

3. The information processing apparatus according to claim 1,
wherein the second determination process is configured to determine the first installation region and the first installation circuit corresponding to a second circuit that is among the second circuits and is installable but is not installed in the reserved region when a second requirement is satisfied, and
wherein the second requirement is configured to be satisfied when second process processing performance of a third circuit for executing a second process is insufficient, and when the reserved region that is a reconfigurable region in which a fourth circuit for executing the second process is installed exists adjacent to a reconfigurable region in which the third circuit is installed, and when the first determination process determines that any of the plurality of second circuits is installable in a region other than the reserved region.

4. The information processing apparatus according to claim 2,
wherein the second determination process is configured to determine that the first installation circuit is installed but is not installed in the reserved region when any of the one or more installable regions extracted by the extraction process does not overlap the reserved region.

5. The information processing apparatus according to claim 2,
wherein the second determination process is configured to determine that the first installation circuit is installed in a reconfigurable region including the reserved region when each of all the one or more installable regions extracted by the extraction process includes the reserved region.

6. The information processing apparatus according to claim 1,
wherein the second determination process is configured to determine any of the plurality of first circuits as the first installation circuit and determine any of the one or more installable regions as the first installation region when the first determination process determines that all the second circuits are not installable in a reconfigurable region adjacent to the one or more installable regions.

7. The information processing apparatus according to claim 1,
wherein the installation process is configured to install, in the programmable circuit, a second circuit, which is among the second circuits and corresponds to the first installation circuit, when first process processing performance of the first installation circuit installed in any of the one or more installable regions is insufficient, and when a reconfigurable region in which the second circuit, which is among the plurality of second circuits and corresponds to the first installation circuit, is installable exists.

8. The information processing apparatus according to claim 1,
wherein the installation process is configured not to install any of the plurality of first circuits in the programmable circuit when the extraction process does not extract the installable region in which the first installation circuit is to be installed, and
wherein the first process is configured to be executed by a program executed by an arithmetic processing device included in the information processing apparatus.

9. The information processing apparatus according to claim 1,
wherein each of the plurality of reconfigurable regions is formed in a rectangular shape, and
wherein the first input and output section of each of the plurality of first circuits is installed in one of four sides of any of the plurality of reconfigurable regions.

10. The information processing apparatus according to claim 1, further comprising:
a memory configured to store configuration information of each of the plurality of first circuits and configuration information of each of the plurality of second circuits.

11. The information processing apparatus according to claim 1,
wherein the number of reconfigurable regions to be used to install each of the plurality of first circuits is equal to the number of reconfigurable regions to be used to install each of the other first circuits.

12. A control method of information processing performed by a computer having a programmable circuit including a plurality of reconfigurable regions in which logic is reconfigurable and a processor coupled to the programmable circuit, the method comprising:
executing an extraction process that includes extracting, from the plurality of reconfigurable regions, one or more installable regions in which any of a plurality of first circuits is installable; each of the plurality of first circuits including a first processing section for executing a first process and a first input and output section for receiving and outputting information; the each of the plurality of first circuits being configured so that the positions of the first input and output sections are different from each other when each of the plurality of first circuits is installed in any of the reconfigurable regions,
executing a first determination process that includes determining whether each of a plurality of second circuits is installable in a first reconfigurable region; the first reconfigurable region being adjacent to the one or more installable regions extracted by the extraction process; each of the plurality of second circuits including a second processing section for executing the first process and a second input and output section to be coupled to a first input and output section among the first input and output sections; each of the plurality of second circuits corresponding to any of the plurality of first circuits, executing a second determination process that includes determining a first installation circuit and a first installation region based on the determination executed by the first determination process; the first installation circuit being among the plurality of first circuits and to be installed in the programmable circuit; the first installation region being a region that is among the one or more installable regions and in which the first installation circuit is to be installed, and executing an installation process that includes installing the first installation circuit determined by the second determination process in the first installation region determined by the second determination process.

13. A non-transitory computer-readable storage medium for storing a program which causes a computer to perform a processing, the computer having a programmable circuit including a plurality of reconfigurable regions in which logic is reconfigurable and a processor coupled to the programmable circuit, the processing comprising:

executing an extraction process that includes extracting, from the plurality of reconfigurable regions, one or more installable regions in which any of a plurality of first circuits is installable; each of the plurality of first circuits including a first processing section for executing a first process and a first input and output section for receiving and outputting information; the each of the plurality of first circuits being configured so that the positions of the first input and output sections are different from each other when each of the plurality of first circuits is installed in any of the reconfigurable regions, executing a first determination process that includes determining whether each of a plurality of second circuits is installable in a first reconfigurable region; the first reconfigurable region being adjacent to the one or more installable regions extracted by the extraction process; each of the plurality of second circuits including a second processing section for executing the first process and a second input and output section to be coupled to a first input and output section among the first input and output sections; each of the plurality of second circuits corresponding to any of the plurality of first circuits, executing a second determination process that includes determining a first installation circuit and a first installation region based on the determination executed by the first determination process; the first installation circuit being among the plurality of first circuits and to be installed in the programmable circuit; the first installation region being a region that is among the one or more installable regions and in which the first installation circuit is to be installed, and executing an installation process that includes installing the first installation circuit determined by the second determination process in the first installation region determined by the second determination process.

\* \* \* \* \*